US009790591B2

(12) United States Patent
Ko et al.

(10) Patent No.: US 9,790,591 B2
(45) Date of Patent: Oct. 17, 2017

(54) TITANIUM-CONTAINING FILM FORMING COMPOSITIONS FOR VAPOR DEPOSITION OF TITANIUM-CONTAINING FILMS

(71) Applicant: L'Air Liquide, Société Anonyme pour l'Etude et l'Exploitation des Procédés Georges Claude, Paris (FR)

(72) Inventors: Changhee Ko, Tsukuba (JP); Julien Gatineau, Seoul (KR); Clément Lansalot-Matras, Princeton, NJ (US); Julien Lieffrig, Soucy (FR); Hana Ishii, Tsukuba (JP)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 4 days.

(21) Appl. No.: 14/954,319

(22) Filed: Nov. 30, 2015

(65) Prior Publication Data
US 2016/0137675 A1 May 19, 2016

(51) Int. Cl.
| C07F 9/66 | (2006.01) |
| C23C 16/18 | (2006.01) |
| C23C 16/34 | (2006.01) |
| C23C 16/40 | (2006.01) |
| C23C 16/44 | (2006.01) |

(52) U.S. Cl.
CPC ............. *C23C 16/18* (2013.01); *C23C 16/34* (2013.01); *C23C 16/405* (2013.01); *C23C 16/4402* (2013.01)

(58) Field of Classification Search
CPC .................................................... C23C 16/18
USPC ........................................................ 556/35
See application file for complete search history.

(56) References Cited

U.S. PATENT DOCUMENTS

| 5,378,501 A | 1/1995 | Foster et al. |
| 5,607,722 A | 3/1997 | Vaartstra et al. |
| 6,949,827 B2 | 9/2005 | Sandhu et al. |
| 8,236,979 B2 * | 8/2012 | Dussarrat ................ C23C 16/18 556/35 |
| 2008/0102205 A1 | 5/2008 | Barry et al. |
| 2008/0241575 A1 | 10/2008 | Lavoie et al. |
| 2009/0036697 A1 | 2/2009 | Tada et al. |
| 2012/0164846 A1 | 6/2012 | Ha et al. |

FOREIGN PATENT DOCUMENTS

| WO | WO 91 08322 | 6/1991 |
| WO | WO 2006 059187 | 6/2006 |
| WO | WO 2009 012341 | 1/2009 |
| WO | WO 2009 087609 | 7/2009 |

OTHER PUBLICATIONS

Haehnel et al., Zeitschrift fuer Anorganische und Allgemeine Chemie (ZAAC), 2014, 640:2532-2536.*
Haehnel et al., J. Amer. Chem. Soc. (JACS), 2012, 134:15979-15991.*
Haehnel et al., Zeitschrift fuer Anorganische und Allgemeine Chemie (ZAAC) (2014) 640 (12-13), pp. 2532-2536.*
Haehnel and Haehnel, J. Amer. Chem. Soc. (JACS) 2012, 134:15979-15991.*
Amemiya, et al., 'High energy aluminum ion implantation using a variable energy radio frequency,' J. Vac. Sci. Technol. A 16(2), Mar.-Apr. 1998, 472-476.
Coles et al., 'Synthesis and Structures of Mono- and Bis(amidinate) Complexes of Aluminum,' Organometallics 1997, 16, 5183-5194.
Felch, et al., 'Plasma doping for the fabrication of ultra-shallow junctions,' Surface and Coatings Technology 156, 2002, 229-236.
Wilkinson et al., 'Bis-cyclopentadienyl Compounds of Ti, Zr, V, Nb and Ta,' J. Am. Chem. Soc., 1954, 76 (17), 4281-4284.
Zhang et al., 'Goldilocks effect of a distal substituent on living Ziegler-Natta polymerization . . . ,' Organometallics 2004, 23, 3512-3520.
Alén, P. et al., "The growth and diffusion barrier properties of atomic layer deposited NbNx thin films," Thin Solid Films, 2005, 491, 235-241.
Carmalt, C.J. et al., "Synthesis of TiN thin films from titanium imido complexes," J. Mater. Chem. 2003, 13, 84-87.
Carmalt, C.J. et al., "Titanium imido complexes as precursors to titanium nitride," J. Chem Soc., Dalton Trans., 2002, 4055-4059.
Dunn, S.C. et al., "Cyclopentadienyl, indenyl and bis(cyclopentadienyl) titanium imido compounds," J. Chem. Soc., Dalton Trans., 1997, 293-304.
Elam, J.W. et al., "Surface chemistry and film growth during TiN atomic layer deposition using TDMAT and $NH_3$," Thin Solid Films, 2003, 436(2), 145-156.
Elers, K.E. et al., "$NbCl_5$ as a precursor in atomic layer epitaxy," Applied Surface Science, 1994, 82-83.
Guiducci, A.E. et al., "Reactions of cyclopentadienyl-amidinate titanium imido compounds with $CS_2$, COS, isocyanates, and other unsaturated organic compounds," Organometallics, 2006, 25, 1167-1187.
Haehnel, M. et al., "Reactions of titanocene bis(trimethylsilyl)acetylene complexes with carbodiimides: an experimental and theoretical study of complexation versus C—N bond activation," J. Am. Chem. Soc., 2012, 134, 15979-15991.
Ritala, M. et al., "Effects of intermediate zinc pulses on properties of TiN and NbN films deposited by atomic layer epitaxy," Applied Surface Science, 1997, 120(3-4), 199-212.
Stewart, P.J. et al., "New binuclear alkyl and half-sandwich cyclopentadienyl imido titanium complexes containing acetamidinate and benzamidinate supporting ligands," Journal of Organometallic Chemistry, 1998, 564, 209-214.
Wasslen, Y.A. et al., "A family of heteroleptic titanium guanidinates: synthesis, thermolysis, and surface reactivity," Inorg. Chem. 2010, 49, 1976-1982.

* cited by examiner

*Primary Examiner* — Sudhakar Katakam
*Assistant Examiner* — Kofi Adzamli
(74) *Attorney, Agent, or Firm* — Patricia E. McQueeney

(57) ABSTRACT

Titanium-containing film forming compositions are disclosed as well as methods of synthesizing the same and methods of forming Titanium-containing films on substrates via vapor deposition processes using the Titanium-containing film forming compositions. The Titanium-containing film forming compositions comprise a precursor having the formula $Ti(R_5Cp)_2(L)$, wherein each R is independently H, an alkyl group, or $R'_3Si$, with each R' independently being H or an alkyl group; L is selected from the group consisting of formamidinates ($N^{R,R'}$-fmd) or amidinates ($N^{R,R'}R''$-amd).

20 Claims, 8 Drawing Sheets

TITANIUM-CONTAINING FILM FORMING COMPOSITIONS FOR VAPOR DEPOSITION OF TITANIUM-CONTAINING FILMS

TECHNICAL FIELD

Titanium-containing film forming compositions are disclosed as well as methods of synthesizing the same and methods of forming Titanium-containing films on substrates via vapor deposition processes using the Titanium-containing film forming compositions. The Titanium-containing film forming compositions comprise precursors having the formula $Ti(R_5Cp)_2(L)$, wherein each R is independently H, an alkyl group, or $R'_3Si$, with each R' independently being H or an alkyl group; L is selected from the group consisting of formamidinates ($N^{R,R'}$-fmd) or amidinates ($N^{R,R'}R''$-amd).

BACKGROUND

Titanium dioxide films ($TiO_2$) have high refractive index, excellent transmittance in the visible and near-IR frequency, and high chemical stability. They have been shown to be useful as anti-reflection coating, sensors, and photocatalysts. The $TiO_2$ thin film is also a promising material for the development of microelectronics, including as an alternative to $ZrO_2$ in the High-K dielectric of Dynamic Random Access Memory (DRAM), due to its high dielectric constant. Moreover, titanium oxide is a constituent of important multi-component oxides such as $BaTiO_3$ and $SrTiO_3$, which are well known to be ferroelectrics. Recently, resistive switching in $TiO_2$ based metal-insulator-metal (MIM) structures attracted considerable interest. Alternatively Titanium oxide can be used to dope the $SiO_2$ hard mask layer improving then the selectivity during the etching steps in the fabrication of the CMOS devices (US2012/0164846).

Rosenthal et al. disclose reactions of titanocene bis(trimethylsilyl)acetylene complexes with carbodiimides. J. Am. Chem. Soc. 2012, 134, 15979-15991.

Barry et al. disclose ALD of metal-containing films using cyclopentadienyl compounds (US2008/0102205). Exemplary compounds include biscyclopentadienyl triisopropylguanidinato titanium (III) (para 0083).

A need remains for developing Titanium-containing precursor molecules suitable for vapor deposition of titanium-containing films.

NOTATION AND NOMENCLATURE

Certain abbreviations, symbols, and terms are used throughout the following description and claims, and include:

As used herein, the indefinite article "a" or "an" means one or more.

As used herein, the terms "approximately" or "about" mean±10% of the value stated.

The standard abbreviations of the elements from the periodic table of elements are used herein. It should be understood that elements may be referred to by these abbreviations (e.g., Ti refers to Titanium, N refers to nitrogen, C refers to carbon, etc.).

As used herein, the term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1_x(NR^2R^3)_{(4-x)}$, where x is 2 or 3, the two or three $R^1$ groups may, but need not be identical to each other or to $R^2$ or to $R^3$.

As used herein, the term "alkyl group" refers to saturated functional groups containing exclusively carbon and hydrogen atoms. Further, the term "alkyl group" refers to linear, branched, or cyclic alkyl groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

As used herein, the abbreviation "Me" refers to a methyl group; the abbreviation "Et" refers to an ethyl group; the abbreviation "Pr" refers to a propyl group; the abbreviation "nPr" refers to a "normal" or linear propyl group; the abbreviation "iPr" refers to an isopropyl group; the abbreviation "Bu" refers to a butyl group; the abbreviation "nBu" refers to a "normal" or linear butyl group; the abbreviation "tBu" refers to a tert-butyl group, also known as 1,1-dimethylethyl; the abbreviation "sBu" refers to a sec-butyl group, also known as 1-methylpropyl; the abbreviation "iBu" refers to an iso-butyl group, also known as 2-methylpropyl; the abbreviation "amyl" refers to an amyl or pentyl group; the abbreviation "tAmyl" refers to a tert-amyl group, also known as 1,1-dimethylpropyl.

As used herein, the abbreviation "Cp" refers to cyclopentadienyl group; the abbreviation "Cp*" refers to a pentamethylcyclopentadienyl group; and the abbreviation "TMS" refers to trimethylsilyl ($Me_3Si$—).

As used herein, the abbreviation "$N^{R,R'}R''$-amd" or $N^R$ R"-amd when R=R' refers to the amidinate ligand [R—N—C(R")=N—R'], wherein R,R' and R" are defined alkyl groups, such as Me, Et, nPr, iPr, nBu, iBi, sBu or tBu; the abbreviation "$N^{R, R'}$-fmd" or $N^R$-fmd when R=R' refers to the formidinate ligand [R—N—C(H)=N—R'], wherein R and R' are defined alkyl groups, such as Me, Et, nPr, iPr, nBu, iBi, sBu or tBu; the abbreviation "$N^{R,R'}$, $N^{R'', R'''}$-gnd" or $N^R$, $N^{R''}$-gnd when R=R' and R"-AR'" refers to the guanidinate ligand [R—N—C(NR"R'")=NR'], wherein R,R', R" and R'" are defined alkyl group such as Me, Et, nPr, iPr, nBu, iBi, sBu or tBu. Although depicted here as having a double bond between the C and N of the ligand backbone, one of ordinary skill in the art will recognize that the amidinate, formidinate and guanidinate ligands do not contain a fixed double bond. Instead, one electron is delocalized amongst the N—C—N chain.

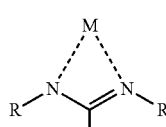

Amidinate ligand

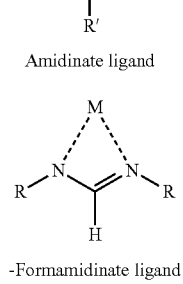

-Formamidinate ligand i)

ii)

-continued iii)

$$\begin{array}{c} M \\ \diagup \diagdown \\ N \cdots N \\ R \diagup \quad \diagdown R \\ \\ R' \diagup N \diagdown R'' \end{array}$$

Guanidinate ligand

SUMMARY

Disclosed are Titanium-containing film forming compositions comprising a precursor having the formula:

Ti(R$_5$Cp)$_2$(L)

wherein each R is independently H, an alkyl group, or R'$_3$Si, with each R' independently being H or an alkyl group; L is selected from the group consisting of formamidinates (N$^{R,R'}$-fmd) or amidinates (N$^{R,R'}$R''-amd). The disclosed Titanium-containing film forming compositions may include one or more of the following aspects:
  each R independently being selected from H, Me, Et, nPr, iPr, tBu, sBu, iBu, nBu, tAmyl, SiMe$_3$, SiMe$_2$H, or SiH$_2$Me;
  L being formamidinate (N$^{R,R'}$-fmd or N$^R$-fmd when R=R');
  the precursor being Ti(Cp)$_2$(N$^{Me}$-fmd);
  the precursor being Ti(Cp)$_2$(N$^{Et}$-fmd);
  the precursor being Ti(Cp)$_2$(N$^{iPr}$-fmd);
  the precursor being Ti(Cp)$_2$(N$^{nPr}$-fmd);
  the precursor being Ti(Cp)$_2$(N$^{iBu}$-fmd);
  the precursor being Ti(Cp)$_2$(N$^{nBu}$-fmd);
  the precursor being Ti(Cp)$_2$(N$^{tBu}$-fmd);
  the precursor being Ti(Cp)$_2$(N$^{sBu}$-fmd);
  the precursor being Ti(Cp)$_2$(N$^{tAm}$-fmd);
  the precursor being Ti(Cp)$_2$(N$^{TMS}$-fmd);
  the precursor being Ti(Cp)$_2$(N$^{Et,\ tBu}$-fmd);
  the precursor being Ti(MeCp)$_2$(N$^{Me}$-fmd);
  the precursor being Ti(MeCp)$_2$(N$^{Et}$-fmd);
  the precursor being Ti(MeCp)$_2$(N$^{iPr}$-fmd);
  the precursor being Ti(MeCp)$_2$(N$^{nPr}$-fmd);
  the precursor being Ti(MeCp)$_2$(N$^{iBu}$-fmd);
  the precursor being Ti(MeCp)$_2$(N$^{nBu}$-fmd);
  the precursor being Ti(MeCp)$_2$(N$^{tBu}$-fmd);
  the precursor being Ti(MeCp)$_2$(N$^{sBu}$-fmd);
  the precursor being Ti(MeCp)$_2$(N$^{tAm}$-fmd);
  the precursor being Ti(MeCp)$_2$(N$^{TMS}$-fmd);
  the precursor being Ti(MeCp)$_2$(N$^{Et,\ tBu}$-fmd);
  the precursor being Ti(EtCp)$_2$(N$^{Me}$-fmd);
  the precursor being Ti(EtCp)$_2$(N$^{Et}$-fmd);
  the precursor being Ti(EtCp)$_2$(N$^{iPr}$-fmd);
  the precursor being Ti(EtCp)$_2$(N$^{nPr}$-fmd);
  the precursor being Ti(EtCp)$_2$(N$^{iBu}$-fmd);
  the precursor being Ti(EtCp)$_2$(N$^{nBu}$-fmd);
  the precursor being Ti(EtCp)$_2$(N$^{tBu}$-fmd);
  the precursor being Ti(EtCp)$_2$(N$^{sBu}$-fmd);
  the precursor being Ti(EtCp)$_2$(N$^{tAm}$-fmd);
  the precursor being Ti(EtCp)$_2$(N$^{TMS}$-fmd);
  the precursor being Ti(EtCp)$_2$(N$^{Et,\ tBu}$-fmd);
  the precursor being Ti(iPrCp)$_2$(N$^{Me}$-fmd);
  the precursor being Ti(iPrCp)$_2$(N$^{Et}$-fmd);
  the precursor being Ti(iPrCp)$_2$(N$^{iPr}$-fmd);
  is the precursor being Ti(iPrCp)$_2$(N$^{nPr}$-fmd);
  the precursor being Ti(iPrCp)$_2$(N$^{iBu}$-fmd);
  the precursor being Ti(iPrCp)$_2$(N$^{nBu}$-fmd);
  the precursor being Ti(iPrCp)$_2$(N$^{tBu}$-fmd);
  the precursor being Ti(iPrCp)$_2$(N$^{sBu}$-fmd);
  the precursor being Ti(iPrCp)$_2$(N$^{tAm}$-fmd);
  the precursor being Ti(iPrCp)$_2$(N$^{TMS}$-fmd);
  the precursor being Ti(iPrCp)$_2$(N$^{Et,\ tBu}$-fmd);
  the precursor being Ti(tBuCp)$_2$(N$^{Me}$-fmd);
  the precursor being Ti(tBuCp)$_2$(N$^{Et}$-fmd);
  the precursor being Ti(tBuCp)$_2$(N$^{iPr}$-fmd);
  the precursor being Ti(tBuCp)$_2$(N$^{nPr}$-fmd);
  the precursor being Ti(tBuCp)$_2$(N$^{iBu}$-fmd);
  the precursor being Ti(tBuCp)$_2$(N$^{nBu}$-fmd);
  the precursor being Ti(tBuCp)$_2$(N$^{tBu}$-fmd);
  the precursor being Ti(tBuCp)$_2$(N$^{sBu}$-fmd);
  the precursor being Ti(tBuCp)$_2$(N$^{tAm}$-fmd);
  the precursor being Ti(tBuCp)$_2$(N$^{TMS}$-fmd);
  the precursor being Ti(tBuCp)$_2$(N$^{Et,\ tBu}$-fmd);
  the precursor being Ti(iPr$_3$Cp)$_2$(N$^{Me}$-fmd);
  the precursor being Ti(iPr$_3$Cp)$_2$(N$^{Et}$-fmd);
  the precursor being Ti(iPr$_3$Cp)$_2$(N$^{iPr}$-fmd);
  the precursor being Ti(iPr$_3$Cp)$_2$(N$^{nPr}$-fmd);
  the precursor being Ti(iPr$_3$Cp)$_2$(N$^{iBu}$-fmd);
  the precursor being Ti(iPr$_3$Cp)$_2$(N$^{nBu}$-fmd);
  the precursor being Ti(iPr$_3$Cp)$_2$(N$^{tBu}$-fmd);
  the precursor being Ti(iPr$_3$Cp)$_2$(N$^{sBu}$-fmd);
  the precursor being Ti(iPr$_3$Cp)$_2$(N$^{tAm}$-fmd);
  the precursor being Ti(iPr$_3$Cp)$_2$(N$^{TMS}$-fmd);
  the precursor being Ti(iPr$_3$Cp)$_2$(N$^{Et,\ tBu}$-fmd);
  the precursor being Ti(Cp*)$_2$(N$^{Me}$-fmd);
  the precursor being Ti(Cp*)$_2$(N$^{Et}$-fmd);
  the precursor being Ti(Cp*)$_2$(N$^{iPr}$-fmd);
  the precursor being Ti(Cp*)$_2$(N$^{nPr}$-fmd);
  the precursor being Ti(Cp*)$_2$(N$^{iBu}$-fmd);
  the precursor being Ti(Cp*)$_2$(N$^{nBu}$-fmd);
  the precursor being Ti(Cp*)$_2$(N$^{tBu}$-fmd);
  the precursor being Ti(Cp*)$_2$(N$^{sBu}$-fmd);
  the precursor being Ti(Cp*)$_2$(N$^{tAm}$-fmd);
  the precursor being Ti(Cp*)$_2$(N$^{TMS}$-fmd);
  the precursor being Ti(Cp*)(N$^{Et,\ tBu}$-fmd);
  the precursor being Ti(Me$_3$SiCp)$_2$(N$^{Me}$-fmd);
  the precursor being Ti(Me$_3$SiCp)$_2$(N$^{Et}$-fmd);
  the precursor being Ti(Me$_3$SiCp)$_2$(N$^{iPr}$-fmd);
  the precursor being Ti(Me$_3$SiCp)$_2$(N$^{nPr}$-fmd);
  the precursor being Ti(Me$_3$SiCp)$_2$(N$^{iBu}$-fmd);
  the precursor being Ti(Me$_3$SiCp)$_2$(N$^{nBu}$-fmd);
  the precursor being Ti(Me$_3$SiCp)$_2$(N$^{tBu}$-fmd);
  the precursor being Ti(Me$_3$SiCp)$_2$(N$^{sBu}$-fmd);
  the precursor being Ti(Me$_3$SiCp)$_2$(N$^{tAm}$-fmd);
  the precursor being Ti(Me$_3$SiCp)$_2$(N$^{TMS}$-fmd);
  the precursor being Ti(Me$_3$SiCp)$_2$(N$^{Et,\ tBu}$-fmd);
  the precursor being Ti(Cp)(Cp*)(N$^{Me}$-fmd);
  the precursor being Ti(iPr$_3$Cp)(Cp)(N$^{Et}$-fmd);
  the precursor being Ti(Cp)(MeCp)(N$^{Et}$-fmd);
  the precursor being Ti(Cp)(EtCp)(N$^{iPr}$-fmd);
  the precursor being Ti(Cp)(iPrCp)(N$^{nPr}$-fmd);
  the precursor being Ti(Cp)(nPrCp)(N$^{iBu}$-fmd);
  the precursor being Ti(Cp)(iBuCp)(N$^{nBu}$-fmd);
  the precursor being Ti(Cp)(tBuCp)(N$^{tBu}$-fmd);
  the precursor being Ti(Cp)(tAmCp)(N$^{sBu}$-fmd);
  L being amidinate (N$^{R,R'}$R''-amd or N$^R$ R''-amd when R=R');
  the precursor being Ti(Cp)$_2$(N$^{Me}$ Me-amd);
  the precursor being Ti(Cp)$_2$(N$^{Et}$ Me-amd);
  the precursor being Ti(Cp)$_2$(N$^{iPr}$ Me-amd);
  the precursor being Ti(Cp)$_2$(N$^{nPr}$ Me-amd);
  the precursor being Ti(Cp)$_2$(N$^{iBu}$ Me-amd);
  the precursor being Ti(Cp)$_2$(N$^{nBu}$ Me-amd);

the precursor being Ti(Cp)$_2$(N$^{tBu}$ Me-amd);
the precursor being Ti(Cp)$_2$(N$^{sBu}$ Me-amd);
the precursor being Ti(Cp)$_2$(N$^{tAm}$ Me-amd);
the precursor being Ti(Cp)$_2$(N$^{TMS}$ Me-amd);
the precursor being Ti(Cp)$_2$(N$^{Et,\ tBu}$ Me-amd);
the precursor being Ti(MeCp)$_2$(N$^{Me}$ Me-amd);
the precursor being Ti(MeCp)$_2$(N$^{Et}$ Me-amd);
the precursor being Ti(MeCp)$_2$(N$^{iPr}$ Me-amd);
the precursor being Ti(MeCp)$_2$(N$^{nPr}$ Me-amd);
the precursor being Ti(MeCp)$_2$(N$^{iBu}$ Me-amd);
the precursor being Ti(MeCp)$_2$(N$^{nBu}$ Me-amd);
the precursor being Ti(MeCp)$_2$(N$^{tBu}$ Me-amd);
the precursor being Ti(MeCp)$_2$(N$^{sBu}$ Me-amd);
the precursor being Ti(MeCp)$_2$(N$^{tAm}$ Me-amd);
the precursor being Ti(MeCp)$_2$(N$^{TMS}$ Me-amd);
the precursor being Ti(MeCp)$_2$(N$^{Et,\ tBu}$ Me-amd);
the precursor being Ti(EtCp)$_2$(N$^{Me}$ Me-amd);
the precursor being Ti(EtCp)$_2$(N$^{Et}$ Me-amd);
the precursor being Ti(EtCp)$_2$(N$^{iPr}$ Me-amd);
the precursor being Ti(EtCp)$_2$(N$^{nPr}$ Me-amd);
the precursor being Ti(EtCp)$_2$(N$^{iBu}$ Me-amd);
the precursor being Ti(EtCp)$_2$(N$^{nBu}$ Me-amd);
the precursor being Ti(EtCp)$_2$(N$^{tBu}$ Me-amd);
the precursor being Ti(EtCp)$_2$(N$^{sBu}$ Me-amd);
the precursor being Ti(EtCp)$_2$(N$^{tAm}$ Me-amd);
the precursor being Ti(EtCp)$_2$(N$^{TMS}$ Me-amd);
the precursor being Ti(EtCp)$_2$(N$^{Et,\ tBu}$ Me-amd);
the precursor being Ti(iPrCp)$_2$(N$^{Me}$ Me-amd);
the precursor being Ti(iPrCp)$_2$(N$^{Et}$ Me-amd);
the precursor being Ti(iPrCp)$_2$(N$^{iPr}$ Me-amd);
the precursor being Ti(iPrCp)$_2$(N$^{nPr}$ Me-amd);
the precursor being Ti(iPrCp)$_2$(N$^{iBu}$ Me-amd);
the precursor being Ti(iPrCp)$_2$(N$^{nBu}$ Me-amd);
the precursor being Ti(iPrCp)$_2$(N$^{tBu}$ Me-amd);
the precursor being Ti(iPrCp)$_2$(N$^{sBu}$ Me-amd);
the precursor being Ti(iPrCp)$_2$(N$^{tAm}$ Me-amd);
a the precursor being Ti(iPrCp)$_2$(N$^{TMS}$ Me-amd);
the precursor being Ti(iPrCp)$_2$(N$^{Et,\ tBu}$ Me-amd);
the precursor being Ti(tBuCp)$_2$(N$^{me}$ Me-amd);
the precursor being Ti(tBuCp)$_2$(N$^{Et}$ Me-amd);
the precursor being Ti(tBuCp)$_2$(N$^{iPr}$ Me-amd);
the precursor being Ti(tBuCp)$_2$(N$^{nPr}$ Me-amd);
the precursor being Ti(tBuCp)$_2$(N$^{iBu}$ Me-amd);
the precursor being Ti(tBuCp)$_2$(N$^{nBu}$ Me-amd);
the precursor being Ti(tBuCp)$_2$(N$^{tBu}$ Me-amd);
the precursor being Ti(tBuCp)$_2$(N$^{sBu}$ Me-amd);
the precursor being Ti(tBuCp)$_2$(N$^{tAm}$ Me-amd);
the precursor being Ti(tBuCp)$_2$(N$^{TMS}$ Me-amd);
the precursor being Ti(tBuCp)$_2$(N$^{Et,\ tBu}$ Me-amd);
the precursor being Ti(iPr$_3$Cp)$_2$(N$^{Me}$ Me-amd);
the precursor being Ti(iPr$_3$Cp)$_2$(N$^{Et}$ Me-amd);
the precursor being Ti(iPr$_3$Cp)$_2$(N$^{iPr}$ Me-amd);
the precursor being Ti(iPr$_3$Cp)$_2$(N$^{nPr}$ Me-amd);
the precursor being Ti(iPr$_3$Cp)$_2$(N$^{iBu}$ Me-amd);
the precursor being Ti(iPr$_3$Cp)$_2$(N$^{nBu}$ Me-amd);
the precursor being Ti(iPr$_3$Cp)$_2$(N$^{tBu}$ Me-amd);
the precursor being Ti(iPr$_3$Cp)$_2$(N$^{sBu}$ Me-amd);
the precursor being Ti(iPr$_3$Cp)$_2$(N$^{tAm}$ Me-amd);
the precursor being Ti(iPr$_3$Cp)$_2$(N$^{TMS}$ Me-amd);
the precursor being Ti(iPr$_3$Cp)$_2$(N$^{Et,\ tBu}$ Me-amd);
the precursor being Ti(Cp*)$_2$(N$^{Me}$ Me-amd);
the precursor being Ti(Cp*)$_2$(N$^{Et}$ Me-amd);
the precursor being Ti(Cp*)$_2$(N$^{iPr}$ Me-amd);
the precursor being Ti(Cp*)$_2$(N$^{nPr}$ Me-amd);
the precursor being Ti(Cp*)$_2$(N$^{iBu}$ Me-amd);
the precursor being Ti(Cp*)$_2$(N$^{nBu}$Me-amd);
the precursor being Ti(Cp*)$_2$(N$^{tBu}$ Me-amd);
the precursor being Ti(Cp*)$_2$(N$^{sBu}$ Me-amd);
the precursor being Ti(Cp*)$_2$(N$^{tAm}$ Me-amd);
the precursor being Ti(Cp*)$_2$(N$^{TMS}$ Me-amd);
the precursor being Ti(Cp*)$_2$(N$^{Et,\ tBu}$ Me-amd);
the precursor being Ti(Me$_3$SiCp)$_2$(N$^{Me}$ Me-amd);
the precursor being Ti(Me$_3$SiCp)$_2$(N$^{Et}$ Me-amd);
the precursor being Ti(Me$_3$SiCp)$_2$(N$^{iPr}$ Me-amd);
the precursor being Ti(Me$_3$SiCp)$_2$(N$^{nPr}$ Me-amd);
the precursor being Ti(Me$_3$SiCp)$_2$(N$^{iBu}$ Me-amd);
the precursor being Ti(Me$_3$SiCp)$_2$(N$^{nBu}$ Me-amd);
the precursor being Ti(Me$_3$SiCp)$_2$(N$^{tBu}$ Me-amd);
the precursor being Ti(Me$_3$SiCp)$_2$(N$^{sBu}$ Me-amd);
the precursor being Ti(Me$_3$SiCp)$_2$(N$^{tAm}$ Me-amd);
the precursor being Ti(Me$_3$SiCp)$_2$(N$^{TMS}$ Me-amd);
the precursor being Ti(Me$_3$SiCp)$_2$(N$^{Et,\ tBu}$ Me-amd);
the precursor being Ti(Cp)(Cp*)(N$^{Me}$ Me-amd);
the precursor being Ti(Cp)(iPr$_3$Cp)(N$^{iPr}$ Me-amd);
the precursor being Ti(Cp)(MeCp)(N$^{Et}$ Me-amd);
the precursor being Ti(Cp)(EtCp)(N$^{iPr}$ Me-amd);
the precursor being Ti(Cp)(iPrCp)(N$^{nPr}$ Me-amd);
the precursor being Ti(Cp)(nPrCp)(N$^{iBu}$ Me-amd);
the precursor being Ti(Cp)(iBuCp)(N$^{nBu}$ Me-amd);
the precursor being Ti(Cp)(tBuCp)(N$^{tBu}$ Me-amd);
the precursor being Ti(Cp)(tAmCp)(N$^{sBu}$ Me-amd);
the precursor being Ti(Cp)$_2$(N$^{iPr}$ Et-amd);
the precursor being Ti(Cp)$_2$(N$^{iPr}$ nPr-amd);
the precursor being Ti(Cp)$_2$(N$^{iPr}$ iPr-amd);
the precursor being Ti(Cp)$_2$(N$^{iPr}$ nBu-amd);
the precursor being Ti(Cp)$_2$(N$^{iPr}$ tBu-amd);
the precursor being Ti(Cp)$_2$(N$^{iPr}$ sBu-amd);
the precursor being Ti(Cp)$_2$(N$^{iPr}$ iBu-amd);
the precursor being Ti(MeCp)$_2$(N$^{iPr}$ Et-amd);
the precursor being Ti(MeCp)$_2$(N$^{iPr}$ nPr-amd);
the precursor being Ti(MeCp)$_2$(N$^{iPr}$ iPr-amd);
the precursor being Ti(MeCp)$_2$(N$^{iPr}$ nBu-amd);
the precursor being Ti(MeCp)$_2$(N$^{iPr}$ tBu-amd);
the precursor being Ti(MeCp)$_2$(N$^{iPr}$ sBu-amd);
the precursor being Ti(MeCp)$_2$(N$^{iPr}$ iBu-amd);
the precursor being Ti(EtCp)$_2$(N$^{iPr}$ Et-amd);
the precursor being Ti(EtCp)$_2$(N$^{iPr}$ nPr-amd);
the precursor being Ti(EtCp)$_2$(N$^{iPr}$ iPr-amd);
the precursor being Ti(EtCp)$_2$(N$^{iPr}$ nBu-amd);
the precursor being Ti(EtCp)$_2$(N$^{iPr}$ tBu-amd);
the precursor being Ti(EtCp)$_2$(N$^{iPr}$ sBu-amd);
the precursor being Ti(EtCp)$_2$(N$^{iPr}$ iBu-amd);
the Titanium-containing film forming composition comprising between approximately 95.0% w/w and approximately 100.0% w/w of the precursor;
the Titanium-containing film forming composition comprising between approximately 5% w/w and approximately 50% w/w of the precursor;
the Titanium-containing film forming composition comprising between approximately 0.0% w/w and approximately 5.0% w/w impurities;
the Titanium-containing film forming composition comprising between approximately 0.0% w/w and approximately 2.0% w/w impurities;
the Titanium-containing film forming composition comprising between approximately 0.0% w/w and approximately 1.0% w/w impurities;
the impurities including carbodiimides; formamidine; amidine; alkylamines; dialkylamines; alkylimines; cyclopentadiene; dicyclopentadiene; THF; ether; pentane; cyclohexane; heptanes; benzene; toluene; chlorinated metal compounds; lithium, sodium, or potassium formamidinate; lithium, sodium, or potassium amidinate; and lithium, sodium, or potassium cyclopentadienyl;

the Titanium-containing film forming composition comprising between approximately 0.0% w/w and approximately 2.0% w/w carbodiimide impurities;

the Titanium-containing film forming composition comprising between approximately 0.0% w/w and approximately 2.0% w/w alkylamine impurities;

the Titanium-containing film forming composition comprising between approximately 0.0% w/w and approximately 2.0% w/w alkylimine impurities;

the Titanium-containing film forming composition comprising between approximately 0.0% w/w and approximately 2.0% w/w cyclopentadiene impurities;

the Titanium-containing film forming composition comprising between approximately 0.0% w/w and approximately 2.0% w/w dicyclopentadiene impurities;

the Titanium-containing film forming composition comprising between approximately 0.0% w/w and approximately 2.0% w/w THF impurities;

the Titanium-containing film forming composition comprising between approximately 0.0% w/w and approximately 2.0% w/w ether impurities;

the Titanium-containing film forming composition comprising between approximately 0.0% w/w and approximately 2.0% w/w pentane impurities;

the Titanium-containing film forming composition comprising between approximately 0.0% w/w and approximately 2.0% w/w cyclohexane impurities;

the Titanium-containing film forming composition comprising between approximately 0.0% w/w and approximately 2.0% w/w heptanes impurities;

the Titanium-containing film forming composition comprising between approximately 0.0% w/w and approximately 2.0% w/w benzene impurities;

the Titanium-containing film forming composition comprising between approximately 0.0% w/w and approximately 2.0% w/w toluene impurities;

the Titanium-containing film forming composition comprising between approximately 0.0% w/w and approximately 2.0% w/w chlorinated metal compound impurities;

the Titanium-containing film forming composition comprising between approximately 0.0% w/w and approximately 2.0% w/w lithium, sodium, or potassium formamidinate impurities;

the Titanium-containing film forming composition comprising between approximately 0.0% w/w and approximately 2.0% w/w lithium, sodium, or potassium amidinate impurities;

the Titanium-containing film forming composition comprising between approximately 0.0% w/w and approximately 2.0% w/w lithium, sodium, or potassium cyclopentadienyl impurities;

the Titanium-containing film forming composition comprising between approximately 0 ppbw and approximately 1 ppmw metal impurities;

the Titanium-containing film forming composition comprising between approximately 0 ppbw and approximately 500 ppbw metal impurities;

the metal impurities including Aluminum (Al), Arsenic (As), Barium (Ba), Beryllium (Be), Bismuth (Bi), Cadmium (Cd), Calcium (Ca), Chromium (Cr), Cobalt (Co), Copper (Cu), Gallium (Ga), Germanium (Ge), Hafnium (Hf), Zirconium (Zr), Indium (In), Iron (Fe), Lead (Pb), Lithium (Li), Magnesium (Mg), Manganese (Mn), Tungsten (W), Nickel (Ni), Potassium (K), Sodium (Na), Strontium (Sr), Thorium (Th), Tin (Sn), Titanium (Ti), Uranium (U), and Zinc (Zn);

the Titanium-containing film forming composition comprising between approximately 0 ppbw and approximately 500 ppbw Al impurities;

the Titanium-containing film forming composition comprising between approximately 0 ppbw and approximately 500 ppbw As impurities;

the Titanium-containing film forming composition comprising between approximately 0 ppbw and approximately 500 ppbw Ba impurities;

the Titanium-containing film forming composition comprising between approximately 0 ppbw and approximately 500 ppbw Be impurities;

the Titanium-containing film forming composition comprising between approximately 0 ppbw and approximately 500 ppbw Bi impurities;

the Titanium-containing film forming composition comprising between approximately 0 ppbw and approximately 500 ppbw Cd impurities;

the Titanium-containing film forming composition comprising between approximately 0 ppbw and approximately 500 ppbw Ca impurities;

the Titanium-containing film forming composition comprising between approximately 0 ppbw and approximately 500 ppbw Cr impurities;

the Titanium-containing film forming composition comprising between approximately 0 ppbw and approximately 500 ppbw Co impurities;

the Titanium-containing film forming composition comprising between approximately 0 ppbw and approximately 500 ppbw Cu impurities;

the Titanium-containing film forming composition comprising between approximately 0 ppbw and approximately 500 ppbw Ga impurities;

the Titanium-containing film forming composition comprising between approximately 0 ppbw and approximately 500 ppbw Ge impurities;

the Titanium-containing film forming composition comprising between approximately 0 ppbw and approximately 500 ppbw Hf impurities;

the Titanium-containing film forming composition comprising between approximately 0 ppbw and approximately 500 ppbw Zr impurities;

the Titanium-containing film forming composition comprising between approximately 0 ppbw and approximately 500 ppbw In impurities;

the Titanium-containing film forming composition comprising between approximately 0 ppbw and approximately 500 ppbw Fe impurities;

the Titanium-containing film forming composition comprising between approximately 0 ppbw and approximately 500 ppbw Pb impurities;

the Titanium-containing film forming composition comprising between approximately 0 ppbw and approximately 500 ppbw Li impurities;

the Titanium-containing film forming composition comprising between approximately 0 ppbw and approximately 500 ppbw Mg impurities;

the Titanium-containing film forming composition comprising between approximately 0 ppbw and approximately 500 ppbw Mn impurities;

the Titanium-containing film forming composition comprising between approximately 0 ppbw and approximately 500 ppbw W impurities;

the Titanium-containing film forming composition comprising between approximately 0 ppbw and approximately 500 ppbw Ni impurities;
the Titanium-containing film forming composition comprising between approximately 0 ppbw and approximately 500 ppbw K impurities;
the Titanium-containing film forming composition comprising between approximately 0 ppbw and approximately 500 ppbw Na impurities;
the Titanium-containing film forming composition comprising between approximately 0 ppbw and approximately 500 ppbw Sr impurities;
the Titanium-containing film forming composition comprising between approximately 0 ppbw and approximately 500 ppbw Th impurities;
the Titanium-containing film forming composition comprising between approximately 0 ppbw and approximately 500 ppbw Sn impurities;
the Titanium-containing film forming composition comprising between approximately 0 ppbw and approximately 500 ppbw Ti impurities;
the Titanium-containing film forming composition comprising between approximately 0 ppbw and approximately 500 ppbw U impurities; and
the Titanium-containing film forming composition comprising between approximately 0 ppbw and approximately 500 ppbw Zn impurities.

Also disclosed is a Ti-containing film forming composition delivery device comprising a canister having an inlet conduit and an outlet conduit and containing any of the Ti-containing film forming compositions disclosed above. The disclosed device may include one or more of the following aspects:
the Ti-containing film forming composition having a total concentration of metal contaminants of less than 10 ppmw;
an end of the inlet conduit end located above a surface of the Ti-containing film forming composition and an end of the outlet conduit located below the surface of the Ti-containing film forming composition;
an end of the inlet conduit end located below a surface of the Ti-containing film forming composition and an end of the outlet conduit located above the surface of the Ti-containing film forming composition; and
further comprising a diaphragm valve on the inlet and the outlet.

Also disclosed are processes for the deposition of Titanium-containing films on substrates. The vapor form of the Titanium-containing film forming composition(s) disclosed above is introduced into a reactor having a substrate disposed therein. At least part of the precursor is deposited onto the substrate to form the Titanium-containing film. The disclosed processes may further include one or more of the following aspects:
introducing at least one reactant into the reactor;
the reactant being selected from the group consisting of $H_2$, $NH_3$, $SiH_4$, $Si_2H_6$, $Si_3H_8$, $SiH_2Me_2$, $SiH_2Et_2$, $N(SiH_3)_3$, hydrogen radicals thereof; and mixtures thereof;
the reactant being selected from the group consisting of: $O_2$, $O_3$, $H_2O$, NO, $N_2O$, oxygen radicals thereof; and mixtures thereof;
the Titanium-containing precursor and the reactant being introduced into the reactor substantially simultaneously;
the reactor being configured for chemical vapor deposition;
the reactor being configured for plasma enhanced chemical vapor deposition;
the Titanium-containing precursor and the reactant being introduced into the chamber sequentially;
the reactor being configured for atomic layer deposition;
the reactor being configured for spatial atomic layer deposition; and
the reactor being configured for plasma enhanced atomic layer deposition.

BRIEF DESCRIPTION OF THE FIGURES

For a further understanding of the nature and objects of the present invention, reference should be made to the following detailed description, taken in conjunction with the accompanying figure wherein.

DESCRIPTION OF PREFERRED EMBODIMENTS

Figure 1:
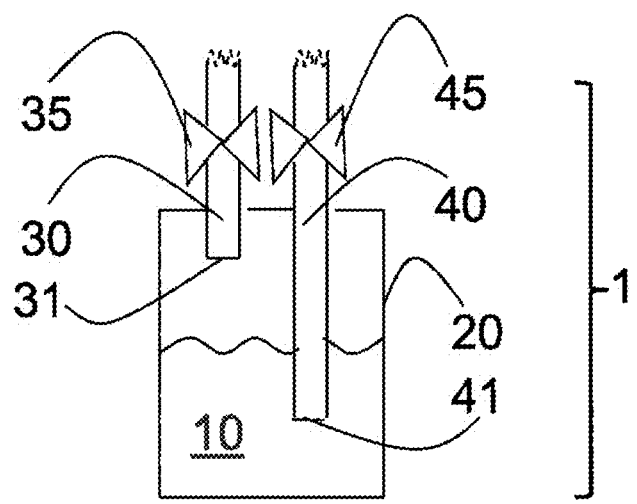
FIG. 1 is a side view of one embodiment of the Ti-containing film forming composition delivery device disclosed herein.

Disclosed are Titanium-containing film forming compositions comprising precursors having the formula:

Ti(R$_5$Cp)$_2$(L)

wherein each R is independently H, an alkyl group, or R'$_3$Si, with each R' independently being H or an alkyl group; and L is selected from the group consisting of formamidinates (N$^{R,R'}$-fmd or N$^R$-fmd when R=R') or amidinates (N$^{R,R'}$R''-amd or N$^R$ R''-amd when R=R').

The precursor may have the formula Ti(R$_5$Cp)$_2$(N$^{R,R'}$-fmd):

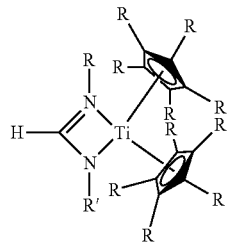

wherein each R and R' is independently H, a C1 to C6 alkyl group, or SiR''$_3$, with each R'' independently being H or a C1 to C6 alkyl group. Preferably, each R and R' is independently H, Me, Et, nPr, iPr, tBu, sBu, iBu, nBu, tAmyl, SiMe$_3$, SiMe$_2$H, or SiH$_2$Me. When R=R' on the fmd ligand, the formula is Ti(R$_5$Cp)$_2$(N$^R$-fmd).

Exemplary precursors include Ti(Cp)$_2$(N$^{Me}$-fmd), Ti(Cp)$_2$(N$^{Et}$-fmd), Ti(Cp)$_2$(N$^{iPr}$-fmd), Ti(Cp)$_2$(N$^{nPr}$-fmd), Ti(Cp)$_2$(N$^{iBu}$-fmd), Ti(Cp)$_2$(N$^{nBu}$-fmd), Ti(Cp)$_2$(N$^{tBu}$-fmd), Ti(Cp)$_2$(N$^{sBu}$-fmd), Ti(Cp)$_2$(N$^{tAm}$-fmd), Ti(Cp)$_2$(N$^{TMS}$-fmd), Ti(MeCp)$_2$(N$^{Me}$-fmd), Ti(MeCp)$_2$(N$^{Et}$-fmd), Ti(MeCp)$_2$(N$^{iPr}$-fmd), Ti(MeCp)$_2$(N$^{nPr}$-fmd), Ti(MeCp)$_2$(N$^{iBu}$-fmd), Ti(MeCp)$_2$(N$^{nBu}$-fmd), Ti(MeCp)$_2$(N$^{tBu}$-fmd), Ti(MeCp)$_2$(N$^{sBu}$-fmd), Ti(MeCp)$_2$(N$^{tAm}$-fmd), Ti(MeCp)$_2$(N$^{TMS}$-fmd), Ti(EtCp)$_2$(N$^{Me}$-fmd), Ti(EtCp)$_2$(N$^{Et}$-fmd), Ti(EtCp)$_2$(N$^{iPr}$-fmd), Ti(EtCp)$_2$(N$^{nPr}$-fmd), Ti(EtCp)$_2$(N$^{iBu}$-fmd), Ti(EtCp)$_2$(N$^{nBu}$-fmd), Ti(EtCp)$_2$(N$^{tBu}$-fmd), Ti(EtCp)$_2$(N$^{sBu}$-fmd), Ti(EtCp)$_2$(N$^{tAm}$-fmd), Ti(EtCp)$_2$(N$^{TMS}$-fmd), Ti(iPrCp)$_2$(N$^{Me}$-fmd), Ti(iPrCp)$_2$(N$^{Et}$-fmd), Ti(iPrCp)$_2$(N$^{iPr}$-fmd), Ti(iPrCp)$_2$(N$^{nPr}$-fmd), Ti(iPrCp)$_2$(N$^{iBu}$-fmd), Ti(iPrCp)$_2$(N$^{nBu}$-fmd), Ti(iPrCp)$_2$(N$^{tBu}$-fmd), Ti(iPrCp)$_2$(N$^{sBu}$-fmd), Ti(iPrCp)$_2$(N$^{tAm}$-fmd), Ti(iPrCp)$_2$(N$^{TMS}$-fmd), Ti(tBuCp)$_2$(N$^{Me}$-fmd), Ti(tBuCp)$_2$(N$^{Et}$-fmd), Ti(tBuCp)$_2$(N$^{iPr}$-fmd), Ti(tBuCp)$_2$(N$^{nPr}$-fmd), Ti(tBuCp)$_2$(N$^{nBu}$-fmd), Ti(tBuCp)$_2$(N$^{nBu}$-fmd), Ti(tBuCp)$_2$(N$^{tBu}$-fmd), Ti(tBuCp)$_2$(N$^{sBu}$-fmd), Ti(tBuCp)$_2$(N$^{tAm}$-fmd), Ti(tBuCp)$_2$(N$^{TMS}$-fmd), Ti(iPr$_3$Cp)$_2$(N$^{Me}$-fmd), Ti(iPr$_3$Cp)$_2$(N$^{Et}$-fmd), Ti(iPr$_3$Cp)$_2$(N$^{iPr}$-fmd), Ti(iPr$_3$Cp)$_2$(N$^{nPr}$-fmd), Ti(iPr$_3$Cp)$_2$(N$^{iBu}$-fmd), Ti(iPr$_3$Cp)$_2$(N$^{nBu}$-fmd), Ti(iPr$_3$Cp)$_2$(N$^{tBu}$-fmd), Ti(iPr$_3$Cp)$_2$(N$^{sBu}$-fmd), Ti(iPr$_3$Cp)$_2$(N$^{tAm}$-fmd), Ti(iPr$_3$Cp)$_2$(N$^{TMS}$-fmd), Ti(Cp*)$_2$(N$^{Me}$-fmd), Ti(Cp*)$_2$(N$^{Et}$-fmd), Ti(Cp*)$_2$(N$^{iPr}$-fmd), Ti(Cp*)$_2$(N$^{nPr}$-fmd), Ti(Cp*)$_2$(N$^{iBu}$-fmd), Ti(Cp*)$_2$(N$^{nBu}$-fmd), Ti(Cp*)$_2$(N$^{tBu}$-fmd), Ti(Cp*)$_2$(N$^{sBu}$-fmd), Ti(Cp*)$_2$(N$^{tAm}$-fmd), Ti(Cp*)$_2$(N$^{TMS}$-fmd), Ti(Me$_3$SiCp)$_2$(N$^{Me}$-fmd), Ti(Me$_3$SiCp)$_2$(N$^{Et}$-fmd), Ti(Me$_3$SiCp)$_2$(N$^{iPr}$-fmd), Ti(Me$_3$SiCp)$_2$(N$^{nPr}$-fmd), Ti(Me$_3$SiCp)$_2$(N$^{iBu}$-fmd), Ti(Me$_3$SiCp)$_2$(N$^{nBu}$-fmd), Ti(Me$_3$SiCp)$_2$(N$^{tBu}$-fmd), Ti(Me$_3$SiCp)$_2$(N$^{sBu}$-fmd), Ti(Me$_3$SiCp)$_2$(N$^{tAm}$-fmd), Ti(Me$_3$SiCp)$_2$(N$^{TMS}$-fmd), Ti(Cp)(Cp*)(N$^{Me}$-fmd), Ti(Cp)(iPr$_3$Cp)(N$^{Me}$-fmd), Ti(Cp)(MeCp)(N$^{Et}$-fmd), Ti(Cp)(EtCp)(N$^{iPr}$-fmd), Ti(Cp)(iPrCp)(N$^{nPr}$-fmd), Ti(Cp)(nPrCp)(N$^{iBu}$-fmd), Ti(Cp)(iBuCp)(N$^{nBu}$-fmd), Ti(Cp)(tBuCp)(N$^{tBu}$-fmd), Ti(Cp)(tAmCp)(N$^{sBu}$-fmd), Ti(Cp)$_2$(N$^{Et,\ tBu}$-fmd), Ti(MeCp)$_2$(N$^{Et,\ tBu}$-fmd) or Ti(EtCp)$_2$(N$^{Et,\ tBu}$-fmd).

These precursors may be synthesized by reacting Ti(R$_5$Cp)$_2$X$_2$ with two (2) equivalents of Z(N$^{R,R'}$-fmd) wherein X is an halogen selected from the group consisting of F, Cl, Br and I; Z is an alkali metal selected from the group consisting of Li, Na and K; and each R and R' is independently H, Me, Et, nPr, iPr, tBu, sBu, iBu, nBu, tAmyl, SiMe$_3$, SiMe$_2$H, or SiH$_2$Me. Ti(R$_5$Cp)$_2$X$_2$ may be prepared as described in J. Am. Chem. Soc 1954, 76, 4281. Z(N$^{R,R'}$-fmd) may be prepared by reaction of an alkyl alkali-metal, such as n-Butyl Lithium (nBuLi), with the corresponding formamidine molecule. The formamidine molecule may be prepared according to the procedure described in Organometallics 2004, 23, 3512-3520. The additions of the reactants may be done at low temperature, the temperature being below −50° C. The reaction may be done in a polar solvent, such as THF or diethylether. The precursor may be separated from alkali salts by extraction with a non polar solvent, such as pentane, hexane, cyclohexane, heptanes, benzene and toluene. The resulting Titanium-containing film forming composition may be purified either by vacuum sublimation, vacuum distillation or by recrystallisation in a suitable solvent selected without limitation from the group consisting of THF, diethylether, pentane, hexane, cyclohexane, heptanes, benzene, toluene, or mixtures thereof.

The precursor may have the formula Ti(R$_5$Cp)$_2$(N$^{R,R'}$R''-amd)

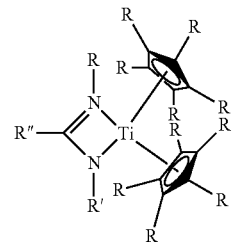

wherein each R,R' and R'' is independently H, a C1 to C6 alkyl group, or SiR'''$_3$, with each R''' independently being H or a C1 to C6 alkyl group. Preferably, each R, R', or R'' is independently H, Me, Et, nPr, iPr, tBu, sBu, iBu, nBu, tAmyl, SiMe$_3$, SiMe$_2$H, or SiH$_2$Me. When R=R' on the amidinate ligand, the formula is Ti(R$_5$Cp)$_2$(N$^R$ R''-amd).

Exemplary precursors include Ti(Cp)$_2$(N$^{Me}$ Me-amd), Ti(Cp)$_2$(N$^{Et}$ Me-amd), Ti(Cp)$_2$(N$^{iPr}$ Me-amd), Ti(Cp)$_2$(N$^{nPr}$ Me-amd), Ti(Cp)$_2$(N$^{iBu}$ Me-amd), Ti(Cp)$_2$(N$^{nBu}$ Me-amd), Ti(Cp)$_2$(N$^{tBu}$ Me-amd), Ti(Cp)$_2$(N$^{sBu}$ Me-amd), Ti(Cp)$_2$(N$^{tAm}$ Me-amd), Ti(Cp)$_2$(N$^{TMS}$ Me-amd), Ti(MeCp)$_2$(N$^{Me}$ Me-amd), Ti(MeCp)$_2$(N$^{Et}$ Me-amd), Ti(MeCp)$_2$(N$^{iPr}$ Me-amd), Ti(MeCp)$_2$(N$^{nPr}$ Me-amd), Ti(MeCp)$_2$(N$^{iBu}$ Me-amd), Ti(MeCp)$_2$(N$^{nBu}$ Me-amd), Ti(MeCp)$_2$(N$^{tBu}$ Me-amd), Ti(MeCp)$_2$(N$^{sBu}$ Me-amd), Ti(MeCp)$_2$(N$^{tAm}$ Me-amd), Ti(MeCp)$_2$(N$^{TMS}$ Me-amd), Ti(EtCp)$_2$(N$^{Me}$ Me-amd), Ti(EtCp)$_2$(N$^{Et}$ Me-amd), Ti(EtCp)$_2$(N$^{iPr}$ Me-amd), Ti(EtCp)$_2$(N$^{nPr}$ Me-amd), Ti(EtCp)$_2$(N$^{iBu}$ Me-amd), Ti(EtCp)$_2$(N$^{nBu}$ Me-amd), Ti(EtCp)$_2$(N$^{tBu}$ Me-amd), Ti(EtCp)$_2$(N$^{sBu}$ Me-amd), Ti(EtCp)$_2$(N$^{tAm}$ Me-amd), Ti(EtCp)$_2$(N$^{TMS}$ Me-amd), Ti(iPrCp)$_2$(N$^{Me}$ Me-amd), Ti(iPrCp)$_2$(N$^{Et}$ Me-amd), Ti(iPrCp)$_2$(N$^{iPr}$ Me-amd), Ti(iPrCp)$_2$(N$^{nPr}$ Me-amd), Ti(iPrCp)$_2$(N$^{iBu}$ Me-amd), Ti(iPrCp)$_2$(N$^{nBu}$ Me-amd), Ti(iPrCp)$_2$(N$^{tBu}$ Me-amd), Ti(iPrCp)$_2$(N$^{sBu}$ Me-amd), Ti(iPrCp)$_2$(N$^{tAm}$ Me-amd), Ti(iPrCp)$_2$(N$^{TMS}$ Me-amd), Ti(tBuCp)$_2$(N$^{Me}$ Me-amd), Ti(tBuCp)$_2$(N$^{Et}$ Me-amd), Ti(tBuCp)$_2$(N$^{iPr}$ Me-amd), Ti(tBuCp)$_2$(N$^{nPr}$ Me-amd), Ti(tBuCp)$_2$(N$^{iBu}$ Me-amd), Ti(tBuCp)$_2$(N$^{nBu}$ Me-amd), Ti(tBuCp)$_2$(N$^{tBu}$ Me-amd), Ti(tBuCp)$_2$(N$^{sBu}$ Me-amd), Ti(tBuCp)$_2$(N$^{tAm}$ Me-amd), Ti(tBuCp)$_2$(N$^{TMS}$ Me-amd), Ti(iPr$_3$Cp)$_2$(N$^{Me}$ Me-amd), Ti(iPr$_3$Cp)$_2$(N$^{Et}$ Me-amd), Ti(iPr$_3$Cp)$_2$(N$^{iPr}$ Me-amd), Ti(iPr$_3$Cp)$_2$(N$^{nPr}$ Me-amd), Ti(iPr$_3$Cp)$_2$(N$^{iBu}$ Me-amd), Ti(iPr$_3$Cp)$_2$(N$^{nBu}$ Me-amd), Ti(iPr$_3$Cp)$_2$(N$^{tBu}$ Me-amd), Ti(iPr$_3$Cp)$_2$(N$^{sBu}$ Me-amd), Ti(iPr$_3$CO$_2$(N$^{tAm}$ Me-amd), Ti(iPr$_3$Cp)$_2$(N$^{TMS}$ Me-amd), Ti(Cp*)$_2$(N$^{Me}$ Me-amd), Ti(Cp*)$_2$(N$^{Et}$ Me-amd), Ti(Cp*)$_2$(N$^{iPr}$ Me-amd), Ti(Cp*)$_2$(N$^{nPr}$ Me-amd), Ti(Cp*)$_2$(N$^{iBu}$ Me-amd), Ti(Cp*)$_2$(N$^{nBu}$ Me-amd), Ti(Cp*)$_2$(N$^{tBu}$ Me-amd), Ti(Cp*)$_2$(N$^{sBu}$ Me-amd), Ti(Cp*)$_2$(N$^{tAm}$ Me-amd), Ti(Cp*)$_2$(N$^{TMS}$ Me-amd), Ti(Me$_3$SiCp)$_2$(N$^{Me}$ Me-amd), Ti(Me$_3$SiCp)$_2$(N$^{Et}$ Me-amd), Ti(Me$_3$SiCp)$_2$(N$^{iPr}$ Me-amd), Ti(Me$_3$SiCp)$_2$(N$^{nPr}$ Me-amd), Ti(Me$_3$SiCp)$_2$(N$^{iBu}$ Me-amd), Ti(Me$_3$SiCp)$_2$(N$^{nBu}$ Me-amd), Ti(Me$_3$SiCp)$_2$(N$^{tBu}$ Me-amd), Ti(Me$_3$SiCp)$_2$(N$^{sBu}$ Me-amd), Ti(Me$_3$SiCp)$_2$(N$^{tAm}$ Me-amd), Ti(Me$_3$SiCp)$_2$(N$^{TMS}$ Me-amd), Ti(Cp)(Cp*)(N$^{Me}$ Me-amd), Ti(Cp)(iPr$_3$Cp)(N$^{Me}$ Me-amd), Ti(Cp)(MeCp)(N$^{Et}$ Me-amd), Ti(Cp)(EtCp)(N$^{iPr}$ Me-amd), Ti(Cp)(iPrCp)(N$^{nPr}$ Me-amd), Ti(Cp)(nPrCp)(N$^{iBu}$ Me-amd), Ti(Cp)(iBuCp)(N$^{nBu}$ Me-amd), Ti(Cp)(tBuCp)(N$^{tBu}$ Me-amd), Ti(Cp)(tAmCp)(N$^{sBu}$ Me-amd), Ti(Cp)$_2$(N$^{iPr}$ Et-amd), Ti(Cp)$_2$(N$^{iPr}$ nPr-amd), Ti(Cp)$_2$(N$^{iPr}$ iPr-amd), Ti(Cp)$_2$(N$^{iPr}$ tBu-amd), Ti(Cp)$_2$(N$^{iPr}$ nBu-amd), Ti(Cp)$_2$(N$^{iPr}$ iBu-amd), Ti(Cp)$_2$(N$^{iPr}$ sBu-amd), Ti(MeCp)$_2$(N$^{iPr}$ Et-amd), Ti(MeCp)$_2$(N$^{iPr}$ nPr-amd), Ti(MeCp)$_2$(N$^{iPr}$ iPr-amd), Ti(MeCp)$_2$(N$^{iPr}$ tBu-amd), Ti(MeCp)$_2$(N$^{iPr}$ nBu-amd), Ti(MeCp)$_2$(N$^{iPr}$ iBu-amd), Ti(MeCp)$_2$(N$^{iPr}$ sBu-amd), Ti(EtCp)$_2$(N$^{iPr}$ Et-amd), Ti(EtCp)$_2$(N$^{iPr}$ nPr-amd), Ti(EtCp)$_2$(N$^{iPr}$ iPr-amd), Ti(EtCp)$_2$(N$^{iPr}$ tBu-amd), Ti(EtCp)$_2$(N$^{iPr}$ nBu-amd), Ti(EtCp)$_2$(N$^{iPr}$ iBu-amd) or Ti(EtCp)$_2$(N$^{iPr}$ sBu-amd).

These precursors may be synthesized by reacting Ti(R$_5$Cp)$_2$X$_2$ with two (2) equivalents of Z(N$^{R,R'}$R''-amd) wherein X is an halogen selected from the group consisting of F, Cl, Br and I; Z is an alkali metal selected from the group consisting of Li, Na and K; and each R,R', and R'' is independently H, Me, Et, nPr, iPr, tBu, sBu, iBu, nBu, tAmyl, SiMe$_3$, SiMe$_2$H, or SiH$_2$Me. Ti(R$_5$Cp)$_2$X$_2$ may be prepared as described in J. Am. Chem. Soc 1954, 76, 4281. Z(N$^{R,R'}$R''-amd) may be prepared as described in Organometallics 1997, 16, 5183-5194. The additions of the reactants may be done at low temperature, the temperature being below −50° C. The reaction may be done in a polar solvent, such as THF and diethylether. The precursor may be separated from alkali salts by extraction with a non polar solvent, such as pentane, hexane, cyclohexane, heptanes, benzene and toluene. The resulting Titanium-containing film forming composition may be purified by vacuum sublimation, vacuum distillation, or by recrystallisation in a suitable solvent, such as THF, diethylether, pentane, hexane, cyclohexane, heptanes, benzene, toluene, or mixtures thereof.

Purity of the disclosed Titanium-containing film forming composition is greater than 95% w/w (i.e., 95.0% w/w to 100.0% w/w), preferably greater than 98% w/w (i.e., 98.0% w/w to 100.0% w/w), and more preferably greater than 99% w/w (i.e., 99.0% w/w to 100.0% w/w). One of ordinary skill in the art will recognize that the purity may be determined by H NMR or gas or liquid chromatography with mass spectrometry. The disclosed Titanium-containing film forming compositions may contain any of the following impurities: carbodiimides; formamidine; amidine; alkylamines; dialkylamines; alkylimines; cyclopentadiene; dicyclopentadiene; THF; ether; pentane; cyclohexane; heptanes; benzene; toluene; chlorinated metal compounds; lithium, sodium or potassium formamidinate; lithium, sodium or potassium amidinate; or lithium, sodium or potassium cyclopentadienyl. The total quantity of these impurities is below 5% w/w (i.e., 0.0% w/w to 5.0% w/w), preferably below 2% w/w (i.e., 0.0% w/w to 2.0% w/w), and more preferably below 1% w/w (i.e., 0.0% w/w to 1.0% w/w). The composition may be purified by recrystallisation, sublimation, distillation, and/or passing the gas or liquid through a suitable adsorbent, such as a 4 A molecular sieve.

Purification of the disclosed Titanium-containing film forming composition may also result in metal impurities at the 0 ppbw to 1 ppmw, preferably 0-500 ppbw (part per billion weight) level. These metal impurities include, but are not limited to, Aluminum (Al), Arsenic (As), Barium (Ba), Beryllium (Be), Bismuth (Bi), Cadmium (Cd), Calcium (Ca), Chromium (Cr), Cobalt (Co), Copper (Cu), Gallium (Ga), Germanium (Ge), Hafnium (Hf), Zirconium (Zr), Indium (In), Iron (Fe), Lead (Pb), Lithium (Li), Magnesium (Mg), Manganese (Mn), Tungsten (W), Nickel (Ni), Potassium (K), Sodium (Na), Strontium (Sr), Thorium (Th), Tin (Sn), Titanium (Ti), Uranium (U), and Zinc (Zn).

Figure 2:
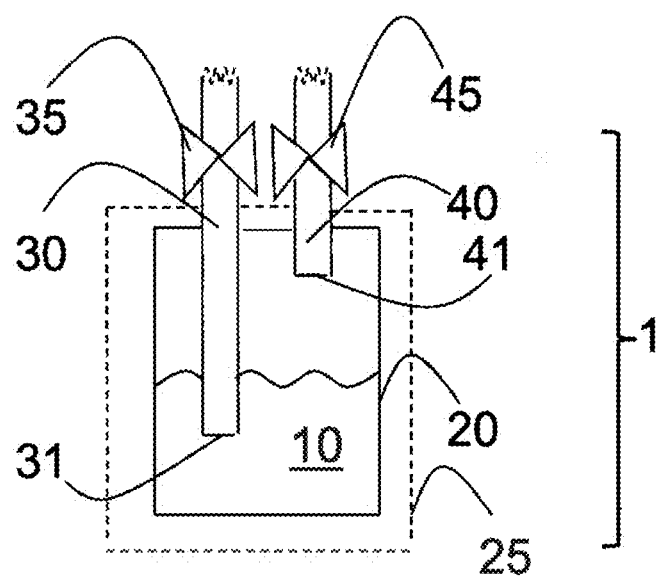
FIG. 2 is a side view of a second embodiment of the Ti-containing film forming composition delivery device disclosed herein.

The Ti-containing film forming compositions may be delivered to a semiconductor processing tool by the disclosed Ti-containing film forming composition delivery devices. FIGS. 1 and 2 show two embodiments of the disclosed delivery devices 1.

FIG. 1 is a side view of one embodiment of the Ti-containing film forming composition delivery device 1. In FIG. 1, the disclosed Ti-containing film forming compositions 10 are contained within a container 20 having two conduits, an inlet conduit 30 and an outlet conduit 40. One of ordinary skill in the precursor art will recognize that the container 20, inlet conduit 30, and outlet conduit 40 are manufactured to prevent the escape of the gaseous form of the Ti-containing film forming composition 10, even at elevated temperature and pressure.

For pyrophoric compositions, as determined by section 33.3.1 of the United Nations Recommendations on the Transport of Dangerous Goods Manual of Tests and Criteria, 5$^{th}$ Edition (2009), the delivery device must be leak tight and be equipped with valves that do not permit even minute amounts of the material. Suitable valves include spring-loaded or tied diaphragm valves. The valve may further comprise a restrictive flow orifice (RFO). The delivery device should be connected to a gas manifold and in an enclosure. The gas manifold should permit the safe evacuation and purging of the piping that may be exposed to air when the delivery device is replaced so that any residual amounts of the pyrophoric material do not react. The enclosure should be equipped with sensors and fire control capability to control the fire in the case of a pyrophoric material release. The gas manifold should also be equipped with isolation valves, vacuum generators, and permit the introduction of a purge gas at a minimum.

The delivery device fluidly connects to other components of the semiconductor processing tool, such as the gas cabinet disclosed above, via valves 35 and 45. Preferably, the delivery device 20, inlet conduit 30, valve 35, outlet conduit 40, and valve 45 are made of 316L EP or 304 stainless steel.

However, one of ordinary skill in the art will recognize that other non-reactive materials may also be used in the teachings herein and that any corrosive Ti-containing film forming compositions 10 may require the use of more corrosion-resistant materials, such as Hastelloy or Inconel.

In FIG. 1, the end 31 of inlet conduit 30 is located above the surface 11 of the Ti-containing film forming composition 10, whereas the end 41 of the outlet conduit 40 is located below the surface 11 of the Ti-containing film forming composition 10. In this embodiment, the Ti-containing film forming composition 10 is preferably in liquid form. An inert gas, including but not limited to nitrogen, argon, helium, and mixtures thereof, may be introduced into the inlet conduit 30. The inert gas pressurizes the delivery device 20 so that the liquid Ti-containing film forming composition 10 is forced through the outlet conduit 40 and to components in the semiconductor processing tool (not shown). The semiconductor processing tool may include a vaporizer which transforms the liquid Ti-containing film forming composition 10 into a vapor, with or without the use of a carrier gas such as helium, argon, nitrogen or mixtures thereof, in order to deliver the vapor to a chamber where a wafer to be repaired is located and treatment occurs in the vapor phase. Alternatively, the liquid Ti-containing film forming composition 10 may be delivered directly to the wafer surface as a jet or aerosol.

FIG. 2 is a side view of a second embodiment of the Ti-containing film forming composition delivery device 1. In FIG. 2, the end 31 of inlet conduit 30 is located below the surface 11 of the Ti-containing film forming composition 10, whereas the end 41 of the outlet conduit 40 is located above the surface 11 of the Ti-containing film forming composition 10. FIG. 2, also includes an optional heating element 25, which may increase the temperature of the Ti-containing film forming composition 10. In this embodiment, the Ti-containing film forming composition 10 may be in solid or liquid form. An inert gas, including but not limited to nitrogen, argon, helium, and mixtures thereof, is introduced into the inlet conduit 30. The inert gas bubbles through the Ti-containing film forming composition 10 and carries a mixture of the inert gas and vaporized Ti-containing film forming composition 10 to the outlet conduit 40 and on to the components in the semiconductor processing tool.

Both FIGS. 1 and 2 include valves 35 and 45. One of ordinary skill in the art will recognize that valves 35 and 45 may be placed in an open or closed position to allow flow through conduits 30 and 40, respectively. Either delivery device 1 in FIG. 1 or 2, or a simpler delivery device having a single conduit terminating above the surface of any solid or liquid present, may be used if the Ti-containing film forming composition 10 is in vapor form or if sufficient vapor pressure is present above the solid/liquid phase. In this case, the Ti-containing film forming composition 10 is delivered in vapor form through the conduit 30 or 40 simply by opening the valve 35 in FIG. 1 or 45 in FIG. 2, respectively. The delivery device 1 may be maintained at a suitable temperature to provide sufficient vapor pressure for the Ti-containing film forming composition 10 to be delivered in vapor form, for example by the use of an optional heating element 25.

While FIGS. 1 and 2 disclose two embodiments of the Ti-containing film forming composition delivery device 1, one of ordinary skill in the art will recognize that the inlet conduit 30 and outlet conduit 40 may both be located above or below the surface 11 of the Ti-containing film forming composition 10 without departing from the disclosure herein. Furthermore, inlet conduit 30 may be a filling port.

Finally, one of ordinary skill in the art will recognize that the disclosed Ti-containing film forming composition may be delivered to semiconductor processing tools using other delivery devices, such as the ampoules disclosed in WO 2006/059187 to Jurcik et al., without departing from the teachings herein.

Also disclosed are methods for forming Titanium-containing layers on a substrate using a vapor deposition process. The method may be useful in the manufacture of semiconductor, photovoltaic, LCD-TFT, or flat panel type devices. The disclosed Titanium-containing film forming compositions may be used to deposit thin Titanium-containing films using any deposition methods known to those of skill in the art. Examples of suitable vapor deposition methods include chemical vapor deposition (CVD) or atomic layer deposition (ALD). Exemplary CVD methods include thermal CVD, plasma enhanced CVD (PECVD), pulsed CVD (PCVD), low pressure CVD (LPCVD), sub-atmospheric CVD (SACVD) or atmospheric pressure CVD (APCVD), hot-wire CVD (HWCVD, also known as cat-CVD, in which a hot wire serves as an energy source for the deposition process), radicals incorporated CVD, and combinations thereof. Exemplary ALD methods include thermal ALD, plasma enhanced ALD (PEALD), spatial isolation ALD, hot-wire ALD (HWALD), radicals incorporated ALD, and combinations thereof. Super critical fluid deposition may also be used. The deposition method is preferably ALD, PE-ALD, or spatial ALD in order to provide suitable step coverage and film thickness control.

The disclosed Titanium-containing film forming compositions may be supplied either in neat form or in a blend with a suitable solvent, such as ethyl benzene, xylene, mesitylene, decalin, decane, dodecane. The disclosed compositions may be present in varying concentrations in the solvent.

One or more of the neat or blended Titanium-containing film forming compositions are introduced into a reactor in vapor form by conventional means, such as tubing and/or flow meters. The composition in vapor form may be produced by vaporizing the neat or blended solution through a conventional vaporization step such as direct vaporization, distillation, or by bubbling, or by using a sublimator such as the one disclosed in PCT Publication WO2009/087609 to Xu et al. The neat or blended composition may be fed in liquid state to a vaporizer where it is vaporized before it is introduced into the reactor. Alternatively, the neat or blended composition may be vaporized by passing a carrier gas into a container containing the composition or by bubbling the carrier gas into the composition. The carrier gas may include, but is not limited to, Ar, He, $N_2$, and mixtures thereof. Bubbling with a carrier gas may also remove any dissolved oxygen present in the neat or blended composition. The carrier gas and composition are then introduced into the reactor as a vapor.

If necessary, the container of disclosed composition may be heated to a temperature that permits the composition to be in its liquid phase and to have a sufficient vapor pressure. The container may be maintained at temperatures in the range of, for example, approximately 0° C. to approximately 150° C. Those skilled in the art recognize that the temperature of the container may be adjusted in a known manner to control the amount of composition vaporized.

The reactor may be any enclosure or chamber within a device in which deposition methods take place such as without limitation, a parallel-plate type reactor, a cold-wall type reactor, a hot-wall type reactor, a single-wafer reactor, a multi-wafer reactor (i.e., a batch reactor), or other types of deposition systems under conditions suitable to cause the precursors to react and form the layers.

The reactor contains one or more substrates onto which the films will be deposited. A substrate is generally defined as the material on which a process is conducted. The substrates may be any suitable substrate used in semiconductor, photovoltaic, flat panel, or LCD-TFT device manufacturing. Examples of suitable substrates include wafers, such as silicon, silica, glass, or GaAs wafers. The wafer may have one or more layers of differing materials deposited on it from a previous manufacturing step. For example, the wafers may include silicon layers (crystalline, amorphous, porous, etc.), silicon oxide layers, silicon nitride layers, silicon oxy nitride layers, carbon doped silicon oxide (SiCOH) layers, or combinations thereof. Additionally, the wafers may include copper layers or noble metal layers (e.g. platinum, palladium, rhodium, or gold). The wafers may include barrier layers, such as manganese, manganese oxide, etc. Plastic layers, such as poly(3,4-ethylenedioxythiophene)poly(styrenesulfonate) [PEDOT:PSS] may also be used. The layers may be planar or patterned. The disclosed processes may deposit the Titanium-containing layer directly on the wafer or directly on one or more than one (when patterned layers form the substrate) of the layers on top of the wafer. Furthermore, one of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates. For example, a Titanium oxide film may be deposited onto a Si layer. The resulting Titanium oxide may be used in DRAM capacitors or for doping silicon oxide hard mask layers. The substrate may be patterned to include vias or trenches having high aspect ratios. For example, a conformal Ti-containing film, such as $TiO_2$, may be deposited using any ALD technique on a through silicon via (TSV) having an aspect ratio ranging from approximately 20:1 to approximately 100:1.

The temperature and the pressure within the reactor are held at conditions suitable for vapor depositions. In other words, after introduction of the vaporized composition into the chamber, conditions within the chamber are such that at least part of the precursor is deposited onto the substrate to form a Titanium-containing film. For instance, the pressure in the reactor may be held between about 1 Pa and about $10^5$ Pa, more preferably between about 25 Pa and about $10^3$ Pa, as required per the deposition parameters. Likewise, the temperature in the reactor may be held between about 100° C. and about 500° C., preferably between about 150° C. and about 400° C. One of ordinary skill in the art will recognize that "at least part of the precursor is deposited" means that some or all of the precursor reacts with or adheres to the substrate.

The temperature of the reactor may be controlled by either controlling the temperature of the substrate holder or controlling the temperature of the reactor wall. Devices used to heat the substrate are known in the art. The reactor wall is heated to a sufficient temperature to obtain the desired film at a sufficient growth rate and with desired physical state and composition. A non-limiting exemplary temperature range to which the reactor wall may be heated includes from approximately 100° C. to approximately 500° C. When a plasma deposition process is utilized, the deposition temperature may range from approximately 150° C. to approximately 400° C. Alternatively, when a thermal process is performed, the deposition temperature may range from approximately 200° C. to approximately 500° C.

In addition to the disclosed Ti-containing film forming compositions, a reactant may also be introduced into the reactor. The reactant may be an oxidizing gas such as one of $O_2$, $O_3$, $H_2O$, $H_2O_2$, NO, $N_2O$, $NO_2$, oxygen containing radicals such as O. or OH., NO, $NO_2$, carboxylic acids, formic acid, acetic acid, propionic acid, and mixtures thereof. Preferably, the oxidizing gas is selected from the group consisting of $O_2$, $O_3$, $H_2O$, $H_2O_2$, oxygen containing radicals thereof such as O. or OH., and mixtures thereof.

Alternatively, the reactant may be a reducing gas such as one of $H_2$, $H_2CO$, $NH_3$, $SiH_4$, $Si_2H_6$, $Si_3H_8$, $(CH_3)_2SiH_2$, $(C_2H_5)_2SiH_2$, $(CH_3)SiH_3$, $(C_2H_5)SiH_3$, phenyl silane, $N_2H_4$, $N(SiH_3)_3$, $N(CH_3)H_2$, $N(C_2H_5)H_2$, $N(CH_3)_2H$, $N(C_2H_5)_2H$, $N(CH_3)_3$, $N(C_2H_5)_3$, $(SiMe_3)_2NH$, $(CH_3)HNNH_2$, $(CH_3)_2NNH_2$, phenyl hydrazine, N-containing molecules, $B_2H_6$, 9-borabicyclo[3,3,1]nonane, dihydrobenzenfuran, pyrazoline, trimethylaluminium, dimethylzinc, diethyizinc, radical species thereof, and mixtures thereof. Preferably, the reducing as is $H_2$, $NH_3$, $SiH_4$, $Si_2H_6$, $Si_3H_3$, $SiH_2Me_2$, $SiH_2Et_2$, $N(SiH_3)_3$, hydrogen radicals thereof, or mixtures thereof.

The reactant may be treated by a plasma, in order to decompose the reactant into its radical form. $N_2$ may also be utilized as a reducing gas when treated with plasma. For instance, the plasma may be generated with a power ranging from about 50 W to about 500 W, preferably from about 100 W to about 400 W. The plasma may be generated or present within the reactor itself. Alternatively, the plasma may generally be at a location removed from the reactor, for instance, in a remotely located plasma system. One of skill in the art will recognize methods and apparatus suitable for such plasma treatment.

For example, the reactant may be introduced into a direct plasma reactor, which generates plasma in the reaction chamber, to produce the plasma-treated reactant in the reaction chamber. Exemplary direct plasma reactors include the Titan™ PECVD System produced by Trion Technologies. The reactant may be introduced and held in the reaction chamber prior to plasma processing. Alternatively, the plasma processing may occur simultaneously with the introduction of the reactant. In-situ plasma is typically a 13.56 MHz RF inductively coupled plasma that is generated between the showerhead and the substrate holder. The substrate or the showerhead may be the powered electrode depending on whether positive ion impact occurs. Typical applied powers in in-situ plasma generators are from approximately 30 W to approximately 1000 W. Preferably, powers from approximately 30 W to approximately 600 W are used in the disclosed methods. More preferably, the powers range from approximately 100 W to approximately 500 W. The disassociation of the reactant using in-situ plasma is typically less than achieved using a remote plasma source for the same power input and is therefore not as efficient in reactant disassociation as a remote plasma system, which may be beneficial for the deposition of Titanium-containing films on substrates easily damaged by plasma.

Alternatively, the plasma-treated reactant may be produced outside of the reaction chamber. The MKS Instruments' ASTRONi® reactive gas generator may be used to treat the reactant prior to passage into the reaction chamber. Operated at 2.45 GHz, 7 kW plasma power, and a pressure ranging from approximately 0.5 Torr to approximately 10 Torr, the reactant $O_2$ may be decomposed into two O. radicals. Preferably, the remote plasma may be generated with a power ranging from about 1 kW to about 10 kW, more preferably from about 2.5 kW to about 7.5 kW.

The vapor deposition conditions within the chamber allow the precursor and the reactant to react and form a Titanium-containing film on the substrate. In some embodiments, Applicants believe that plasma-treating the reactant may provide the reactant with the energy needed to react with the precursor.

Depending on what type of film is desired to be deposited, an additional precursor compound may be introduced into the reactor. The precursor may be used to provide additional elements to the Titanium-containing film. The additional elements may include lanthanides (Ytterbium, Erbium, Dysprosium, Gadolinium, Praseodymium, Cerium, Lanthanum, Yttrium), zirconium, germanium, silicon, titanium, manganese, ruthenium, bismuth, lead, magnesium, aluminum, or mixtures of these. When an additional precursor compound is utilized, the resultant film deposited on the substrate contains the Titanium metal in combination with at least one additional element.

The Titanium-containing film forming compositions and reactants may be introduced into the reactor either simultaneously (chemical vapor deposition), sequentially (atomic layer deposition) or different combinations thereof. The reactor may be purged with an inert gas between the introduction of the composition and the introduction of the reactant. Alternatively, the reactant and the composition may be mixed together to form a reactant/composition mixture, and then introduced to the reactor in mixture form. Another example is to introduce the reactant continuously and to introduce the at least one Titanium-containing film forming composition by pulse (pulsed chemical vapor deposition).

The vaporized composition and the reactant may be pulsed sequentially or simultaneously (e.g. pulsed CVD) into the reactor. Each pulse of composition may last for a time period ranging from about 0.01 seconds to about 10 seconds, alternatively from about 0.3 seconds to about 3 seconds, alternatively from about 0.5 seconds to about 2 seconds. In another embodiment, the reactant may also be pulsed into the reactor. In such embodiments, the pulse of each gas may last for a time period ranging from about 0.01 seconds to about 10 seconds, alternatively from about 0.3 seconds to about 3 seconds, alternatively from about 0.5 seconds to about 2 seconds. In another alternative, the vaporized composition and one or more reactants may be simultaneously sprayed from a shower head under which a susceptor holding several wafers is spun (spatial ALD).

Depending on the particular process parameters, deposition may take place for a varying length of time. Generally, deposition may be allowed to continue as long as desired or necessary to produce a film with the necessary properties. Typical film thicknesses may vary from several angstroms to several hundreds of microns, depending on the specific deposition process. The deposition process may also be performed as many times as necessary to obtain the desired film.

In one non-limiting exemplary CVD type process, the vapor phase of the disclosed Titanium-containing film forming composition and an oxidizing gas are simultaneously introduced into the reactor. The two react to form the titanium oxide thin film. When the reactant in this exemplary CVD process is treated with a plasma, the exemplary CVD process becomes an exemplary PECVD process. The reactant may be treated with plasma prior or subsequent to introduction into the chamber.

In one non-limiting exemplary ALD type process, the vapor phase of Titanium-containing film forming composition is introduced into the reactor, where it is contacted with a suitable substrate. Excess Titanium-containing film forming composition may then be removed from the reactor by purging and/or evacuating the reactor. A desired gas (for example, $O_3$) is introduced into the reactor where it reacts with the physic- or chemisorbed precursor in a self-limiting manner to form a Titanium oxide film. Any excess oxidizing gas is removed from the reactor by purging and/or evacuating the reactor. These two steps may be repeated until the Titanium oxide film obtains a desired thickness.

The resulting Ti oxide may be used in DRAM capacitors or for doping silicon oxide hard mask layers.

Alternatively, if the desired film contains the Titanium transition metal and a second element, the two-step process above may be followed by introduction of the vapor of an additional precursor compound into the reactor. The additional precursor compound will be selected based on the nature of the Titanium-containing film being deposited. After introduction into the reactor, the additional precursor compound is contacted with the substrate. Any excess precursor compound is removed from the reactor by purging and/or evacuating the reactor. Once again, a desired gas may be introduced into the reactor to react with the physic- or chemisorbed precursor compound. Excess gas is removed from the reactor by purging and/or evacuating the reactor. If a desired film thickness has been achieved, the process may be terminated. However, if a thicker film is desired, the entire four-step process may be repeated. By alternating the provision of the Titanium-containing film forming composition, additional precursor compound, and reactant, a film of desired composition and thickness can be deposited.

When the reactant in this exemplary ALD process is treated with a plasma, the exemplary ALD process becomes an exemplary PEALD process. The reactant may be treated with plasma prior or subsequent to introduction into the chamber.

In a second non-limiting exemplary ALD type process, the vapor phase of one of the disclosed Titanium-containing precursor, for example Titanium bis ethylcyclopentadienyl diisopropylamidinate (Ta(EtCp)$_2$(N$^{iPr}$ Me-amd)), is introduced into the reactor, where it is contacted with a TiN, NbN or Ru substrate. Excess precursor may then be removed from the reactor by purging and/or evacuating the reactor. A desired gas (for example, $O_3$) is introduced into the reactor where it reacts with the absorbed precursor in a self-limiting manner to form a Titanium oxide film. Any excess $O_3$ gas is removed from the reactor by purging and/or evacuating the reactor. These two steps may be repeated until the Titanium Oxide film obtains a desired thickness, typically around 10 to 100 angstroms. TiN, NbN or Ru may then be deposited on the TiO$_2$ film. For example, TiCl$_4$ may serve as the Ti precursor to form the TiN layer. NbCl$_5$ may serve as the Nb precursor to form the NbN layer. TORUS™ (RuO$_4$ solution) may serve as the Ru precursor to form the Ru layer. The resulting TiN/TiO$_2$/TiN stack, NbN/TiO$_2$/NbN stack, Ru/TiO$_2$/Ru stack or TiN/TiO$_2$/Ru stack may be used in DRAM capacitors.

The Titanium oxide thin films resulting from the processes discussed above may include a pure Titanium oxide of formula Ti$_n$O$_m$ wherein m and n are integers which inclusively range from 1 to 6. One of ordinary skill in the art will recognize that by judicial selection of the appropriate disclosed Ti-containing film forming composition, optional precursor compounds, and reactant species, the desired film composition may be obtained.

Upon obtaining a desired film thickness, the film may be subject to further processing, such as thermal annealing, furnace-annealing, rapid thermal annealing, UV or e-beam curing, and/or plasma gas exposure. Those skilled in the art recognize the systems and methods utilized to perform these additional processing steps. For example, the Ti-containing film may be exposed to a temperature ranging from approximately 200° C. and approximately 1000° C. for a time ranging from approximately 0.1 second to approximately 7200 seconds under an inert atmosphere, a H-containing atmosphere, a N-containing atmosphere, an O-containing atmosphere, or combinations thereof. Most preferably, the temperature is 400° C. for 3600 seconds under a H-containing atmosphere or an O-containing atmosphere. The resulting film may contain fewer impurities and therefore may have an improved density resulting in improved leakage current. The annealing step may be performed in the same reaction chamber in which the deposition process is performed. Alternatively, the substrate may be removed from the reaction chamber, with the annealing/flash annealing process being performed in a separate apparatus. Any of the above post-treatment methods, but especially thermal annealing, has been found effective to reduce carbon and nitrogen contamination of the Ti-containing film. This in turn tends to improve the resistivity of the film.

After annealing, the Titanium-containing films deposited by any of the disclosed processes may have a bulk resistivity at room temperature of approximately 10 μohm·cm to approximately 50 μohm·cm. Room temperature is approximately 20° C. to approximately 28° C. depending on the season. Bulk resistivity is also known as volume resistivity. One of ordinary skill in the art will recognize that the bulk resistivity is measured at room temperature on Ti films that are typically approximately 50 nm thick. The bulk resistivity typically increases for thinner films due to changes in the electron transport mechanism. The bulk resistivity also increases at higher temperatures.

In another alternative, the disclosed Ti-containing film forming compositions may be used as doping or implantation agents. Part of the precursor in the composition may be deposited on top of the film to be doped, such as an indium oxide ($In_2O_3$) film, vanadium dioxide ($VO_2$) film, a titanium oxide film, a copper oxide film, or a tin dioxide ($SnO_2$) film. The Titanium then diffuses into the film during an annealing step to form the Titanium-doped films {(Ti)$In_2O_3$, (Ti)$VO_2$, (Ti)TiO, (Ti)CuO, or (Ti)$SnO_2$}. See, e.g., US2008/0241575 to Lavoie et al., the doping method of which is incorporated herein by reference in its entirety. Alternatively, high energy ion implantation using a variable energy radio frequency quadrupole implanter may be used to dope the Titanium of the disclosed precursors into a film. See, e.g., Kensuke et al., JVSTA 16(2) March/April 1998, the implantation method of which is incorporated herein by reference in its entirety. In another alternative, plasma doping, pulsed plasma doping or plasma immersion ion implantation may be performed using the disclosed Ti-containing film forming compositions. See, e.g., Felch et al., Plasma doping for the fabrication of ultra-shallow junctions Surface Coatings Technology, 156 (1-3) 2002, pp. 229-236, the doping method of which is incorporated herein by reference in its entirety.

EXAMPLES

The following examples illustrate experiments performed in conjunction with the disclosure herein. The examples are not intended to be all inclusive and are not intended to limit the scope of disclosure described herein.

Example 1: Bis-Cyclopentadienyl Diisopropylacetamidinato Titanium Synthesis (TiCp$_2$(N$^{iPr}$Me-amd))

To a solution of diisopropyl carbodiimide (2.0 g, 16 mmol) in ca. 20 mL of THF at −78° C., was added dropwise MeLi (10 mL, 16 mmol). After stirring 3 h at room temperature, the mixture was added to a solution of Ti(Cp)$_2$(Cl)$_2$ (2.32 g, 7.9 mmol) in ca. 20 mL of THF at −78° C. The mixture was stirred overnight at room temperature. Solvent was then removed under vacuum and the product was extracted with toluene to give a black solid. The material was then purified by sublimation up to 190° C. @ 20 mTorr to give 1.08 g (37%) of pure blue solid.

Figure 3:
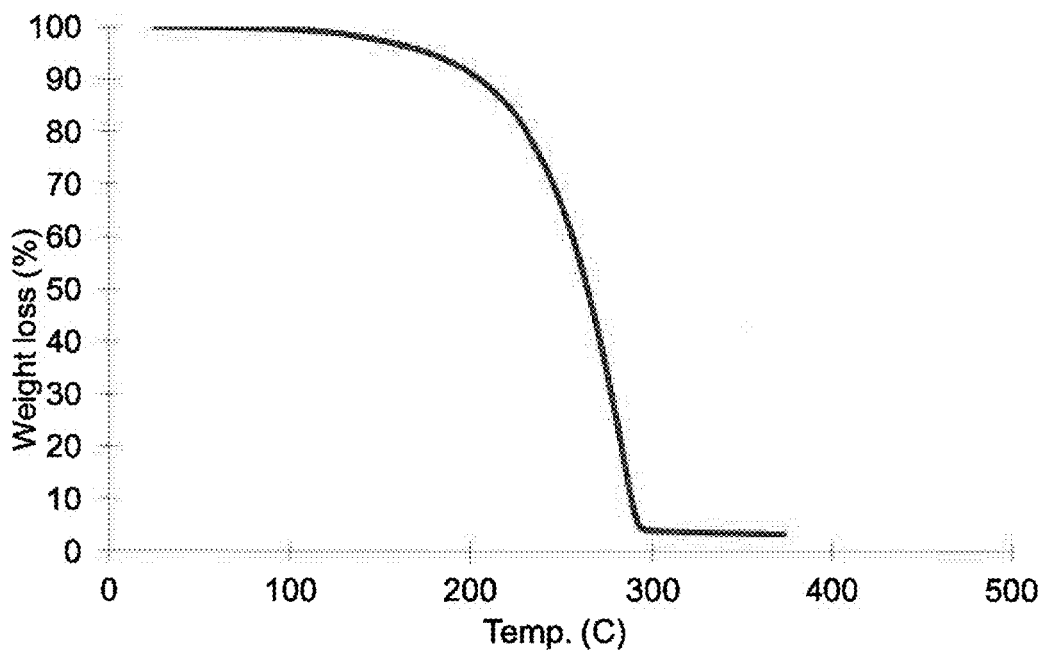
FIG. 3 is a ThermoGravimetric Analysis (TGA) graph demonstrating the percentage of weight loss with increasing temperature of bis-cyclopentadienyl diisopropylacetamidinato Titanium.

The solid left a 3.0% residual mass during Open-Cup ThermoGraimetric Analysis (TGA) measured at a temperature rising rate of 10° C./min in an atmosphere which flows nitrogen at 200 mL/min (6% during Close-Cup). These results are shown in FIG. 3, which is a TGA graph illustrating the percentage of weight loss upon temperature increase.

Example 2: Bis-Methylcyclopentadienyl Diisopropylacetamidinato Titanium Synthesis (Ti(MeCp)$_2$(N$^{iPr}$Me-amd))

To a diluted solution of freshly cracked Cp (3 mL, 29 mmol) in THF at −78° C., nBuLi (18.4 mL, 29 mmol) is added dropwise. The white suspension is let stirring overnight at room temperature. To a yellow solution of TiCl$_4$ (5.8 mL 53 mmol) in THF at −78° C., Li(MeCp) is added dropwise. The cooling bath is removed and the black mixture is let stirring slowly warming up to room temperature. After one night, solvent is removed under vacuum, then toluene is added to the residues and the mixture is filtered hot to remove chloride salt. The solution is concentrated under vacuum and the product is crystallized at −30° C. affording 1.67 g of red-purple powder. To a colorless solution of diisopropylcarbodiimide (1.52 g, 12 mmol) in THF at −78° C., MeLi (7.5 mL 12 mol) is added dropwise affording a white suspension. The cooling bath is removed and the mixture is let stirring slowly warming up to room temperature. To a dark red solution of Ti(MeCp)$_2$Cl$_2$ (1.67 g, 6 mmol) in THF at −78° C., Li(iPrAMD) is added dropwise. The cooling bath is not removed and the mixture is let stirring overnight slowly warming up to room temperature. After one night, solvent is removed under vacuum to give a dark yellow oil. Pentane is added to the dark yellow residues and the mixture is filtered to remove chloride salt. Pentane is removed under vacuum and the crude (dark oil) is purified by vacuum distillation. Target is collected at 150° C. (20 mTorr/head=80° C.) affording a dark blue waxy solid.

Figure 4:
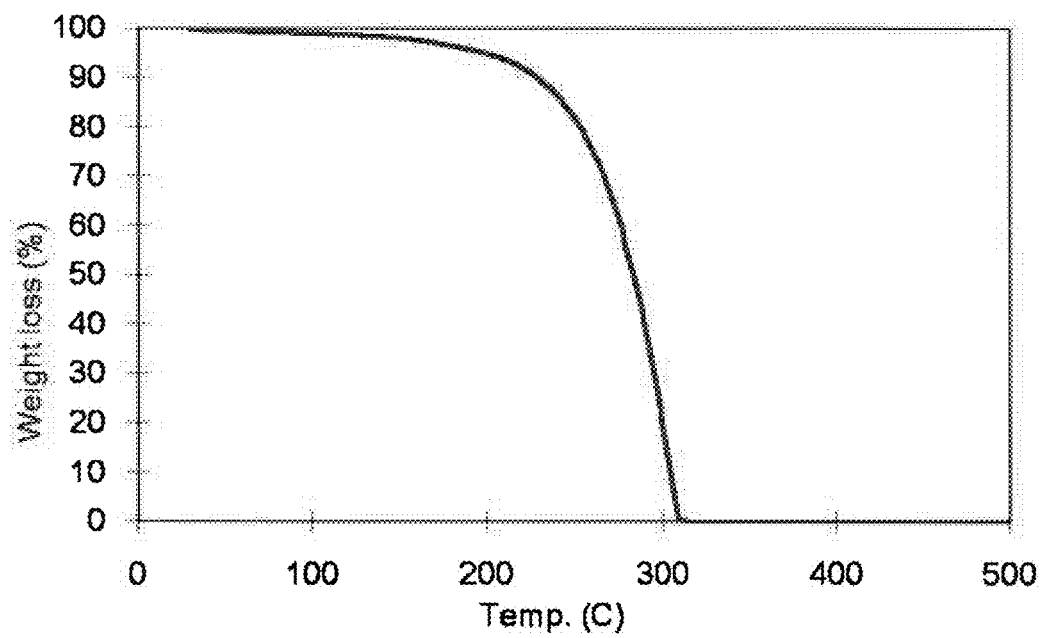
FIG. 4 is a TGA graph demonstrating the percentage of weight loss with increasing temperature of bis-methylcyclopentadienyl diisopropylacetamidinato Titanium.

The solid left a 0% residual mass during Open-Cup TGA analysis measured at a temperature rising rate of 10° C./min in an atmosphere which flows nitrogen at 200 mL/min (10% during Close-Cup). These results are shown in FIG. 4, which is a TGA graph illustrating the percentage of weight loss upon temperature increase.

Example 3: Bis-Ethylcyclopentadienyl Diisopropylacetamidinato Titanium Synthesis (Ti(EtCp)$_2$(N$^{iPr}$Me-amd))

To a colorless solution of diisopropylcarbodiimide (4.55 g 36 mmol) in THF (100 mL) at −78° C., MeLi (22.5 mL 36 mol) is added dropwise in 10 min affording a white suspension. The cooling bath is removed and the mixture is let stirring slowly warming up to room temperature. After 4 h, to a dark red solution of Ti(EtCp)$_2$Cl$_2$ (5.5 g 18 mol) in THF (200 mL) at −78° C., Li(iPrAMD) is added dropwise. The cooling bath is not removed and the mixture is let stirring overnight slowly warming up to room temperature. After one night, solvent is removed under vacuum to give dark oil. Pentane is added to the dark yellow residues and the mixture is filtered to remove chloride salt. The dark yellow oil is purified by vacuum distillation at 40 mTorr. Target is obtained as a dark blue oil (2.65 g 43%). This liquid state may make vapor delivery of this precursor easier than the solid states of the analogous precursors of Examples 1 and 2. More particularly, the liquid state may provide a more consistent and reproducible vapor concentration as compared to that of the solid state precursors.

Figure 5:
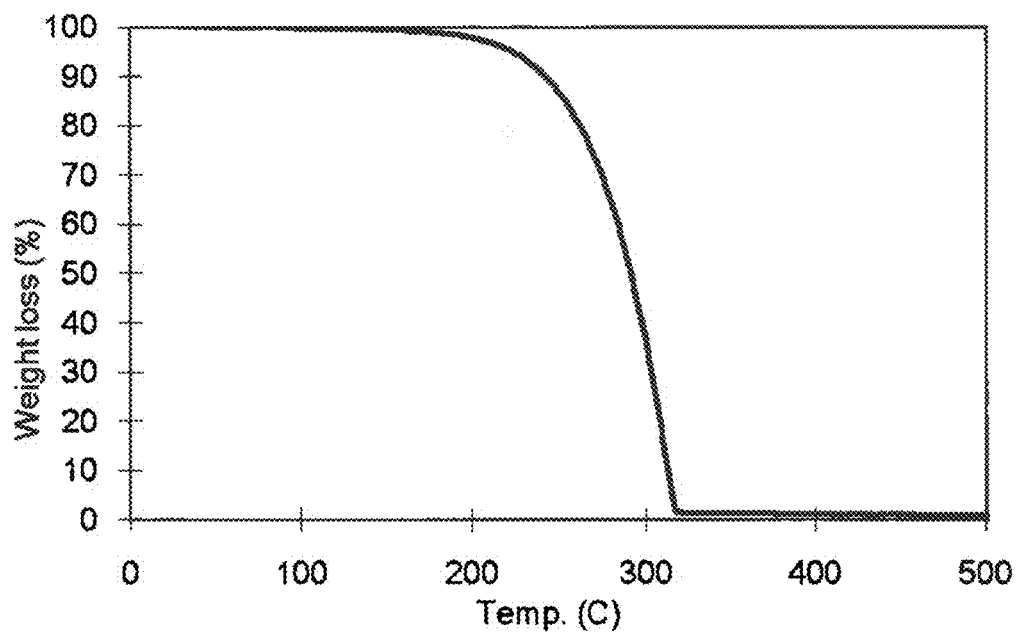
FIG. 5 is a TGA graph demonstrating the percentage of weight loss with increasing temperature of bis-ethylcyclopentadienyl diisopropylacetamidinato Titanium.

The oil left a 0.6% residual mass during Open-Cup TGA analysis measured at a temperature rising rate of 10° C./min in an atmosphere which flows nitrogen at 200 mL/min (6% during Close-Cup). These results are shown in FIG. 5, which is a TGA graph illustrating the percentage of weight loss upon temperature increase.

Example 4: Bis-Isopropylcyclopentadienyl Diisopropylacetamidinato Titanium Synthesis (Ti(iPrCp)$_2$ (N$^{iPr}$ Me-amd))

To a colorless solution of TiCl$_4$ (5.8 mL 53 mmol) in THF at −78° C., Na(iPrCp) (13.7 g 105 mmol) in solution in THF is added dropwise. The cooling bath is removed and the mixture is let stirring slowly warming up to room temperature. After one night, solvent is removed under vacuum, then toluene is added to the residues and the mixture is filtered to remove chloride salt. The solution is concentrated under vacuum and the product is crystallized at −30° C. affording a brown solid. To a colorless solution of diisopropylcarbodiimide (1.9 mL 13 mmol) in THF at −78° C., MeLi (8 mL 13 mol) is added dropwise affording a white suspension. The cooling bath is removed and the mixture is let stirring slowly warming up to room temperature. To a dark red solution of Ti(iPrCp)$_2$Cl$_2$ (2.04 g 13 mmol) in THF at −78° C., Li(iPrAMD) is added dropwise. The cooling bath is not removed and the mixture is let stirring overnight slowly warming up to room temperature. After one night, the mixture is heated at reflux (90° C.) during 8 h, then solvent is removed under vacuum to give a dark oil. Pentane is added to the dark yellow residues and the mixture is filtered to remove chloride salt. Pentane is removed under vacuum and the crude (dark oil) is purified by vacuum distillation. Target is collected at 190° C. (45 mTorr/head=110-120° C.) affording 0.76 g (31%) of dark blue oil. As in Example 3, this liquid state may make vapor delivery of this precursor easier than the solid states of the analogous precursors of Examples 1 and 2.

Figure 6:
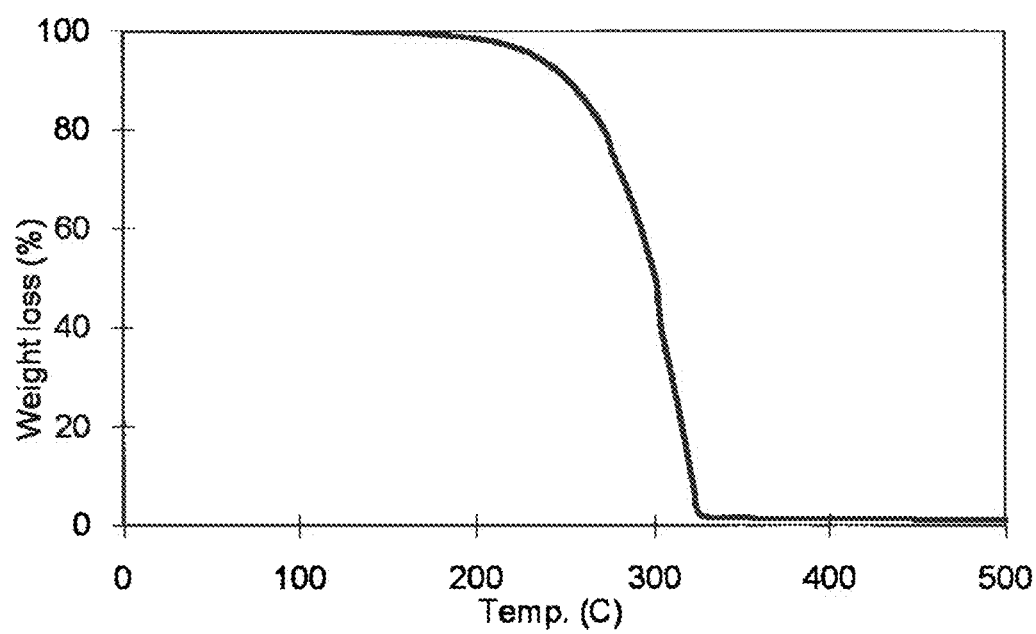
FIG. 6 is a TGA graph demonstrating the percentage of weight loss with increasing temperature of bis-isopropylcyclopentadienyl diisopropylacetamidinato titanium.

The oil left a 1.1% residual mass during Open-Cup TGA analysis measured at a temperature rising rate of 10° C./min in an atmosphere which flows nitrogen at 200 mL/min (13% during Close-Cup). These results are shown in FIG. 6, which is a TGA graph illustrating the percentage of weight loss upon temperature increase.

Example 5: Bis-Cyclopentadienyl Di-Tertbutylacetamidinato Titanium Synthesis (TiCp$_2$(N$^{tBu}$ Me-amd))

To a solution of di-tertbutylcarbodiimide (2.46 g, 16 mmol) in ca. 20 mL of THF at −78° C., was added dropwise MeLi (10 mL, 16 mmol). After stirring 3 h at room temperature, the mixture was added to a solution of Ti(Cp)$_2$(Cl)$_2$ (2.32 g, 7.9 mmol) in ca. 20 mL of THF at −78° C. The mixture was stirred overnight at room temperature. Solvent was then removed under vacuum and the product was extracted with toluene to give a black solid. The material was then purified by sublimation at 90-100° C. @ 400 mTorr to give 1.64 g (60%) of pure blue solid.

Figure 7:
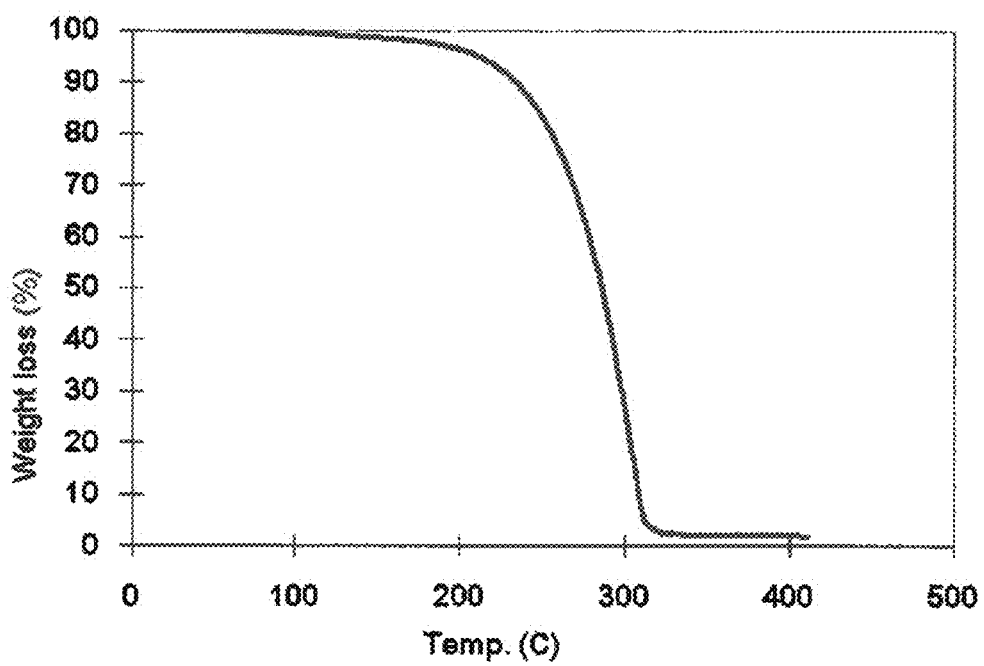
FIG. 7 is a TGA graph demonstrating the percentage of weight loss with increasing temperature of bis-isopropylcyclopentadienyl di tertbutylacetamidinato titanium.

The solid left a 3.0% residual mass during Open-Cup TGA analysis measured at a temperature rising rate of 10° C./min in an atmosphere which flows nitrogen at 200 mL/min (6% during Close-Cup). These results are shown in FIG. 7, which is a TGA graph illustrating the percentage of weight loss upon temperature increase.

Example 6: Bis-Cyclopentadienyl Tertbutyl, Ethylacetamidinato Titanium Synthesis (TiCp$_2$ (N$^{tBu, Et}$ Me-amd))

To a solution of tertbutyl, ethylcarbodiimide (2.02 g, 16 mmol) in ca. 20 mL of THF at −78° C., was added dropwise MeLi (10 mL, 16 mmol). After stirring 3 h at room temperature, the mixture was added to a solution of Ti(Cp)$_2$(Cl)$_2$ (2.32 g, 7.9 mmol) in ca. 20 mL of THF at −78° C. The mixture was stirred overnight at room temperature. Solvent was then removed under vacuum and the product was extracted with toluene to give a black solid. The material was then purified by sublimation at 90-100° C. @ 400 mTorr to give 1.26 g (50%) of pure blue solid.

Figure 8:
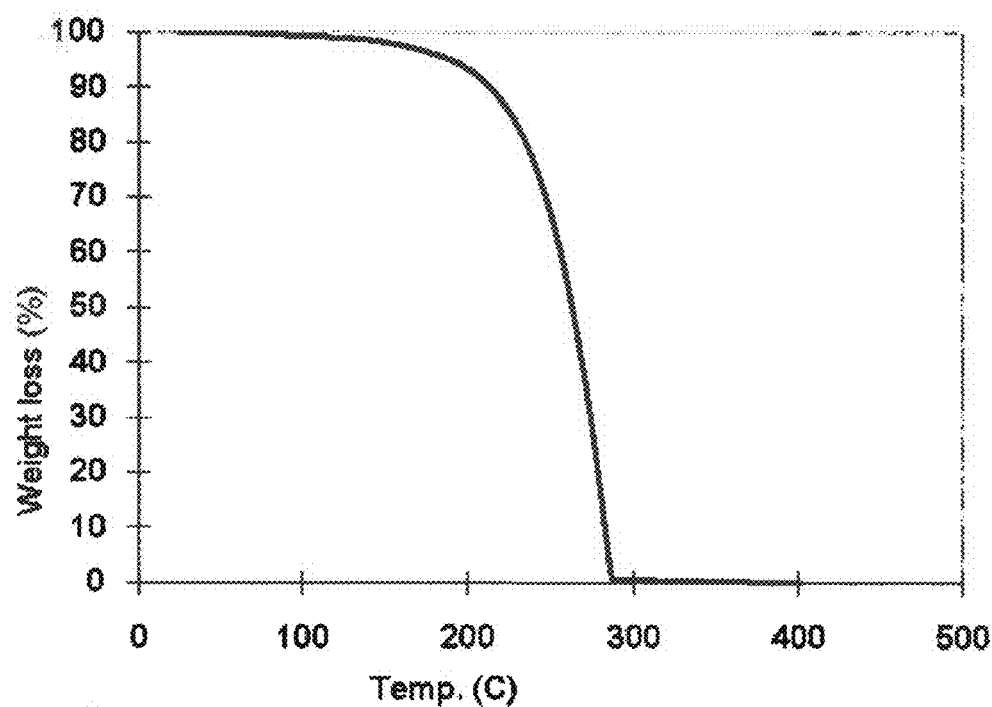
FIG. 8 is a TGA graph demonstrating the percentage of weight loss with increasing temperature of bis-cyclopentadienyl tertbuty, ethylacetamidinato titanium.

The solid left a 2.2% residual mass during Open-Cup TGA analysis measured at a temperature rising rate of 10° C./min in an atmosphere which flows nitrogen at 200 mL/min (6% during Close-Cup). These results are shown in FIG. 8, which is a TGA graph illustrating the percentage of weight loss upon temperature increase.

Example 7: Bis-Cyclopentadienyl Diisopropylvaleramidinato Titanium Synthesis (TiCp$_2$(N$^{iPr}$ nBu-amd))

To a solution of diisopropylcarbodiimide (2.0 g, 16 mmol) in ca. 20 mL of THF at −78° C., was added dropwise nBuLi (16 mmol). After stirring 3 h at room temperature, the mixture was added to a solution of Ti(Cp)$_2$(Cl)$_2$ (2.32 g, 7.9 mmol) in ca. 20 mL of THF at −78° C. The mixture was stirred overnight at room temperature. Solvent was then removed under vacuum and the product was extracted with toluene to give a black solid. The material was then purified by sublimation at 100-110° C. @ 400 mTorr to give 1.45 g (50%) of pure blue solid.

Figure 9:
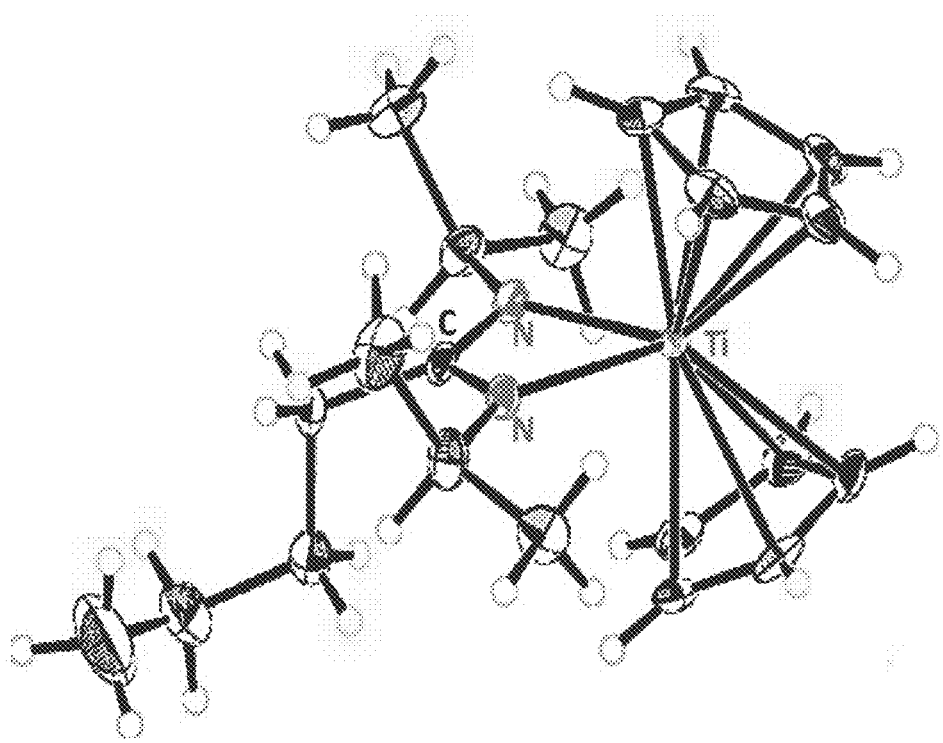
FIG. 9 is a X-RayDiffractometry Analysis (XRD) of a single crystal of bis-cyclopentadienyl diisopropylvaleramidinato Titanium.

100 mg of TiCp$_2$(N$^{iPr}$ nBu-amd) was recrystallized slowly in hexane at RT, and needle-shape blue single crystals were collected. FIG. 9 shows the single crystal structure of TiCp$_2$(N$^{iPr}$ nBu-amd), which was determined by X-Ray Diffraction.

Example 8: ALD of TiO$_2$ Using Ti(EtCp)$_2$(N$^{iPr}$ Me-amd)

Figure 10:
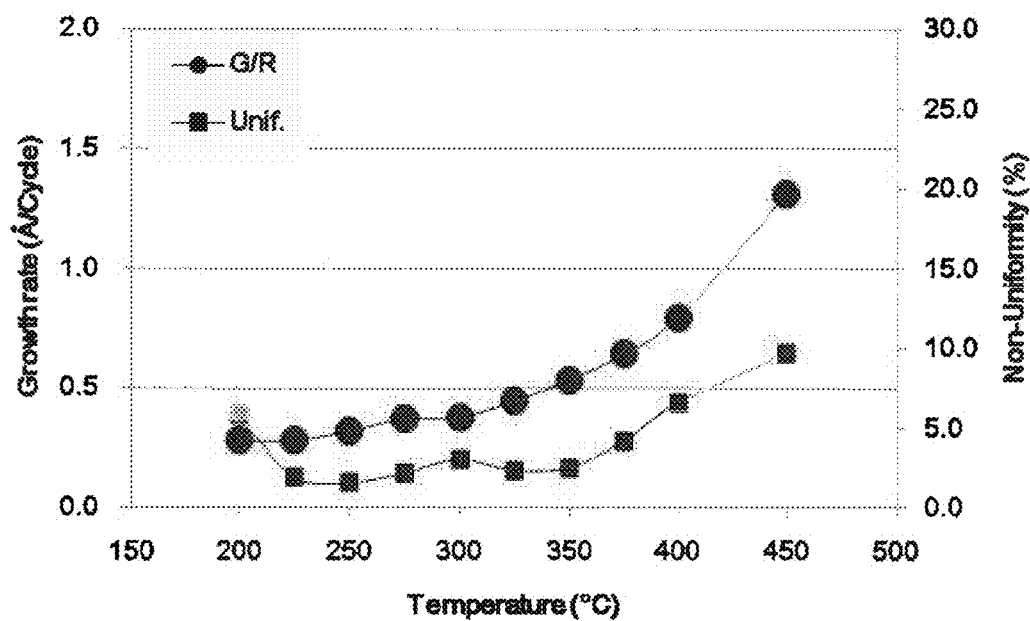
FIG. 10 is a graph of the ALD growth rate of Titanium oxide thin film as a function of the temperature using the precursor bis-ethylcyclopentadienyl diisopropylacetamidinato Titanium.
Figure 11:
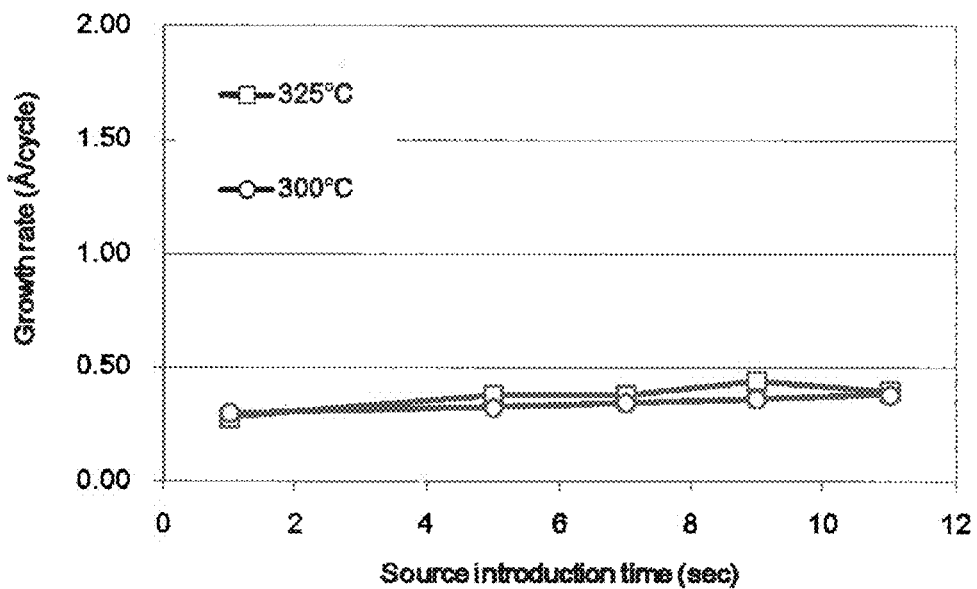
FIG. 11 is a graph of the ALD growth rate of Titanium oxide thin film as a function of the precursor introduction time and using the precursor bis-ethylcyclopentadienyl diisopropylacetamidinato Titanium.

ALD tests were performed using the Ti(EtCp)$_2$(N$^{iPr}$ Me-amd) prepared in Example 3, which was be placed in a vessel heated up to 120° C. and O$_3$ as reactant. Typical ALD conditions were used with a reactor pressure fixed at ~0.5 Torr. ALD behavior with complete surface saturation and reaction were assessed in a temperature window of 200-450° C. on pure silicon wafers. FIG. 10 shows the growth rates of TiO$_2$ in ALD mode using Ti(EtCp)$_2$(N$^{iPr}$ Me-amd) as a function of the temperature. Growth rate was assessed to be 0.3–0.5 Å/cycle between 250 and 350° C. which is the maximum ALD temperature where the precursor doesn't thermally decompose. FIG. 11 shows the growth rates of $TiO_2$ in ALD mode using $Ti(EtCp)_2(N^{iPr}$ Me-amd) as a function of the precursor introduction time at 300 and 325° C. A perfect saturation with stable growth rate with precursor introduction time was observed at 300 and 325° C. which demonstrate a surface saturation regime.

Figure 12:
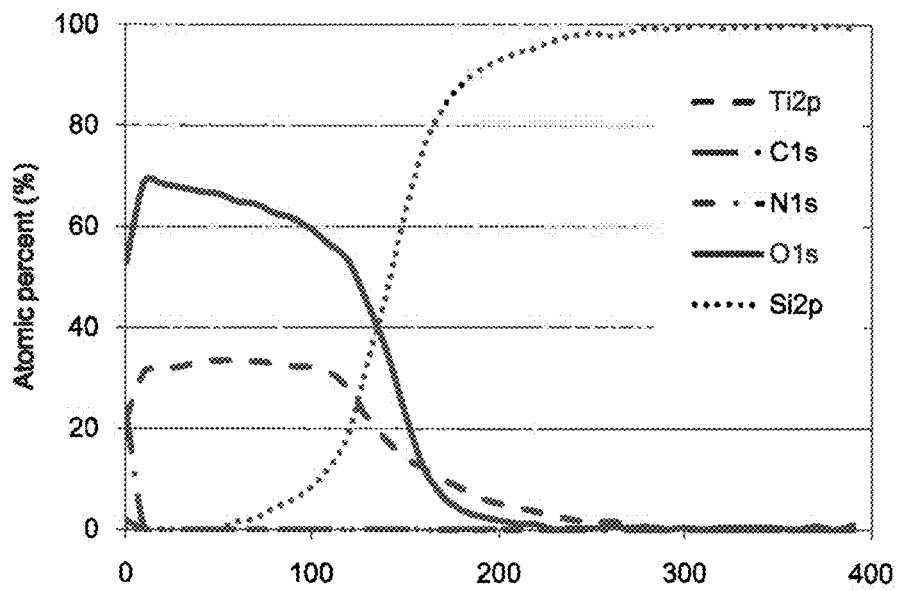
FIG. 12 shows the X-ray Photoelectron Spectroscopy (XPS) analysis of the film produced at 250° C. using the precursor bis-ethylcyclopentadienyl diisopropylacetamidinato Titanium.
Figure 13:
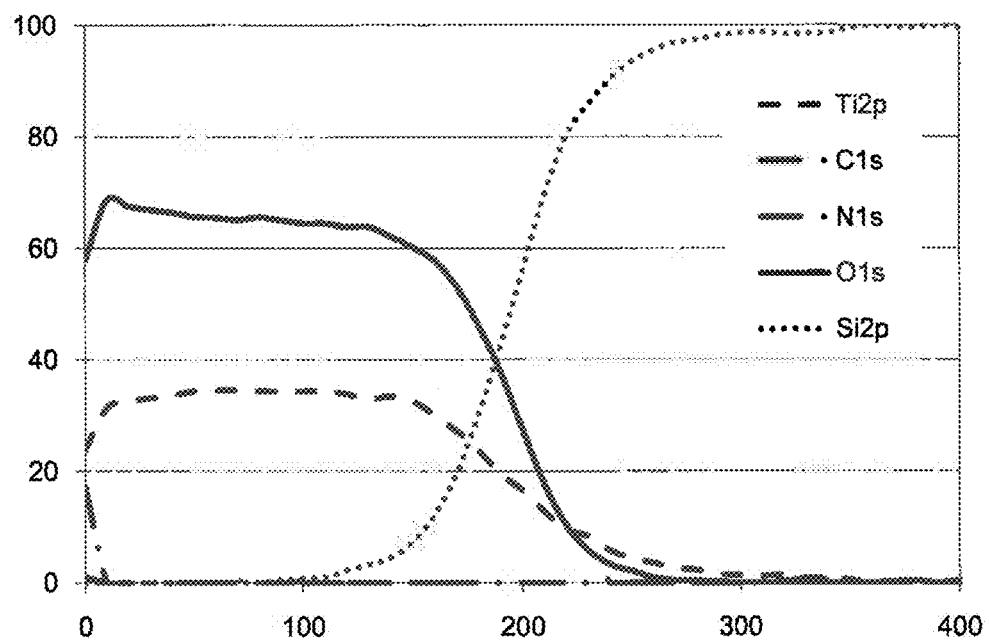
FIG. 13 shows the XPS analysis of the film produced at 300° C. using the precursor bis-ethylcyclopentadienyl diisopropylacetamidinato Titanium.
Figure 14:
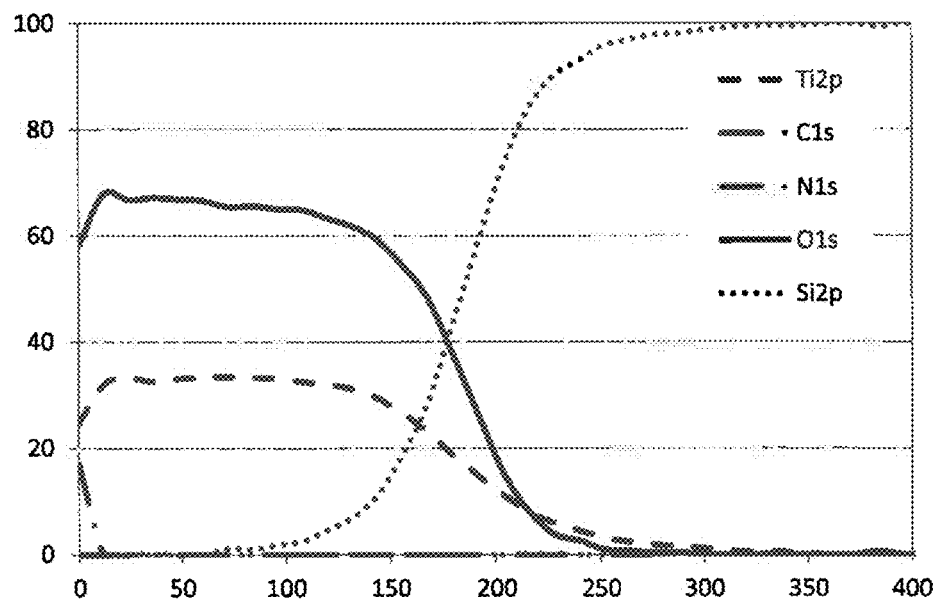
FIG. 14 shows the XPS analysis of the film produced at 350° C. using the precursor bis-ethylcyclopentadienyl diisopropylacetamidinato Titanium.

FIG. 12, FIG. 13 and FIG. 14 show the X-ray Photoelectron Spectroscopy (XPS) analysis of the film produced at 250, 300 and 350° C. respectively.

Example 9: ALD of TiN Using $TiCp_2(N^{iPr}$ Me-amd)

Figure 15:
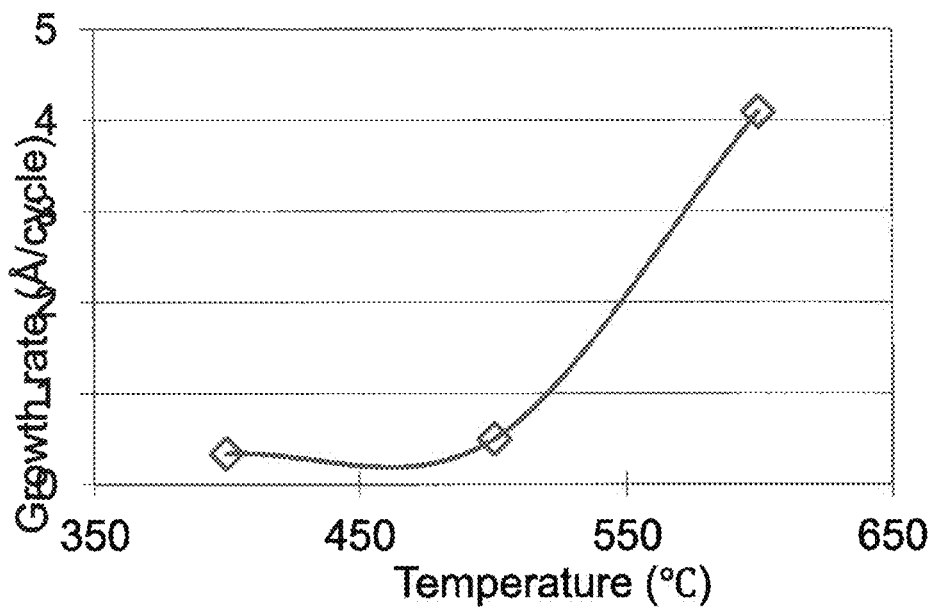
FIG. 15 is a graph of the ALD growth rate of Titanium nitride thin film as a function of the temperature using the precursor bis-cyclopentadienyl diisopropylacetamidinato Titanium.
Figure 16:
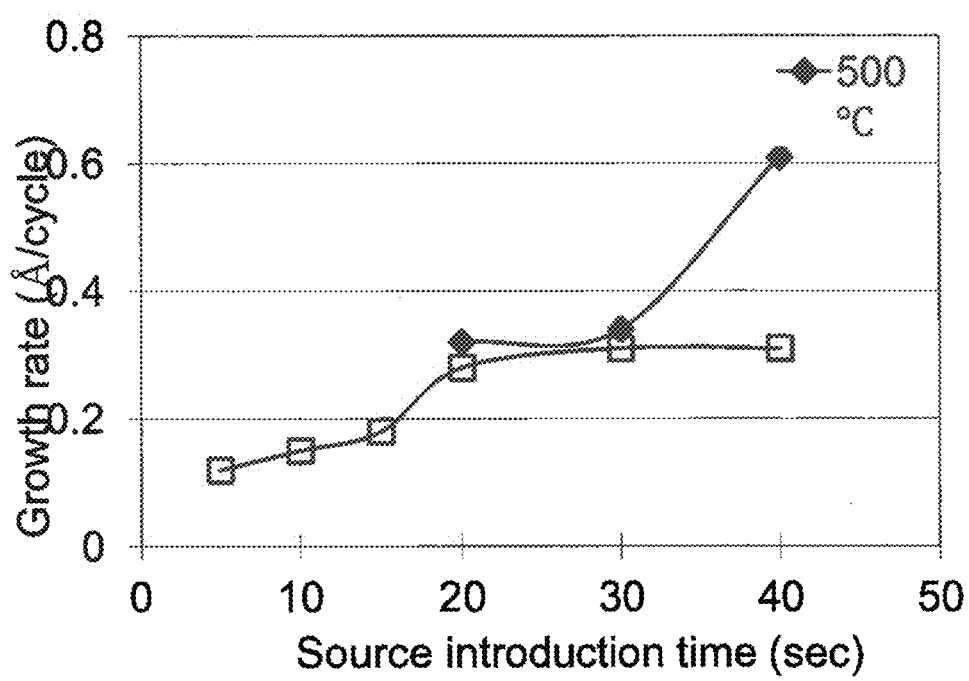
FIG. 16 is a graph of the ALD growth rate of Titanium nitride thin film as a function of the precursor introduction time and using the precursor bis-cyclopentadienyl diisopropylacetamidinato Titanium.

ALD tests were performed using the $TiCp_2(N^{iPr}$ Me-amd) similar to that prepared in Example 1, which was be placed in a vessel heated up to 90° C. and $NH_3$ as reactant. Typical ALD conditions were used with a reactor pressure fixed at ~1 Torr. ALD behavior with complete surface saturation and reaction were assessed in a set temperature window of 400-500° C. on pure silicon wafers. The set temperature is the temperature to which the R&D reactor was set and is higher than the actual substrate temperature, which varies along the substrate surface (i.e., is cooler near the inlet and outlet of the reactor than near the center of the reactor). FIG. 15 shows the growth rates of TiN in ALD mode using $TiCp_2(N^{iPr}$ Me-amd) as a function of the set temperature. Growth rate was assessed to be 0.3 Å/cycle up to 450° C. FIG. 16 shows the growth rates of $TiO_2$ in ALD mode using $TiCp_2(N^{iPr}$ Me-amd) as a function of the precursor introduction time at 450 and 500° C. A perfect saturation with stable growth rate with precursor introduction time was observed at 450 and 500° C. which demonstrate a surface saturation regime. The Ti content in the resulting films averaged approximately 10 atomic %, with the balance of the film being oxygen (approximately 52 atomic %), nitrogen (approximately 23 atomic %, and carbon (approximately 15 atomic %). These results further demonstrate that the reaction between the precursor and the nitrogen-containing reactant is not equivalent to the oxygen containing reactant (i.e., comparing the results of Examples 8 and 9) and/or that the liquid precursors of Examples 3 and 4 provide superior films to those of the solid precursors of Examples 1, 2, and 5-7.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

We claim:

1. A Titanium-containing film forming composition comprising a liquid precursor having the formula $Ti(R_5Cp)_2(L)$ wherein Cp is cyclopentadienyl, each R is independently H, an alkyl group, or $R'_3Si$, with each R' independently being H or an alkyl group; and L is a formamidinate ligand having the chemical formula R—N—C(H)=N—R', shown as:

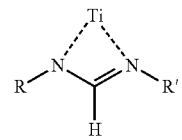

($N^{R',R'}$-fmd or $N^R$-fmd when R=R') or am idinate ligand having the chemical formula R—N—C(R")=N—R', shown as:

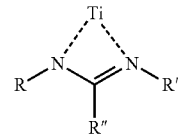

($N^{R',R'}R"$-amd or $N^RR"$-amd when R=R'), wherein R and R' are alkyl groups or $SiMe_3$ and R" is an alkyl group.

2. The Titanium-containing film forming composition of claim 1, wherein the liquid precursor has the formula $Ti(R_5Cp)_2(N^{R',R'}$-fmd) or $Ti(R_5Cp)_2(N^R$-fmd) when R=R'.

3. The Titanium-containing film forming composition of claim 2, wherein the liquid precursor is selected from the group consisting $Ti(Cp)_2(N^{Me}$-fmd), $Ti(Cp)_2(N^{Et}$-fmd), $Ti(Cp)_2(N^{iPr}$-fmd), $Ti(Cp)_2(N^{nPr}$-fmd), $Ti(Cp)_2(N^{iBu}$-fmd), $Ti(Cp)_2(N^{nBu}$-fmd), $Ti(Cp)_2(N^{tBu}$-fmd), $Ti(Cp)_2(N^{sBu}$-fmd), $Ti(Cp)_2(N^{tAm}$-fmd), $Ti(Cp)_2(N^{TMS}$-fmd), $Ti(MeCp)_2(N^{Me}$-fmd), $Ti(MeCp)_2(N^{Et}$-fmd), $Ti(MeCp)_2(N^{iPr}$-fmd), $Ti(MeCp)_2(N^{nPr}$-fmd), $Ti(MeCp)_2(N^{iBu}$-fmd), $Ti(MeCp)_2(N^{nBu}$-fmd), $Ti(MeCp)_2(N^{tBu}$-fmd), $Ti(MeCp)_2(N^{sBu}$-fmd), $Ti(MeCp)_2(N^{tAm}$-fmd), $Ti(MeCp)_2(N^{TMS}$-fmd), $Ti(EtCp)_2(N^{Me}$-fmd), $Ti(EtCp)_2(N^{Et}$-fmd), $Ti(EtCp)_2(N^{iPr}$-fmd), $Ti(EtCp)_2(N^{nPr}$-fmd), $Ti(EtCp)_2(N^{iBu}$-fmd), $Ti(EtCp)_2(N^{nBu}$-fmd), $Ti(EtCp)_2(N^{tBu}$-fmd), $Ti(EtCp)_2(N^{sBu}$-fmd), $Ti(EtCp)_2(N^{tAm}$-fmd), $Ti(EtCp)_2(N^{TMS}$-fmd), $Ti(iPrCp)_2(N^{Me}$-fmd), $Ti(iPrCp)_2(N^{Et}$-fmd), $Ti(iPrCp)_2(N^{iPr}$-fmd), $Ti(iPrCp)_2(N^{nPr}$-fmd), $Ti(iPrCp)_2(N^{iBu}$-fmd), $Ti(iPrCp)_2(N^{nBu}$-fmd), $Ti(iPrCp)_2(N^{tBu}$-fmd), $Ti(iPrCp)_2(N^{sBu}$-fmd), $Ti(iPrCp)_2(N^{tAm}$-fmd), $Ti(iPrCp)_2(N^{TMS}$-fmd), $Ti(tBuCp)_2(N^{Me}$-fmd), $Ti(tBuCp)_2(N^{Et}$-fmd), $Ti(tBuCp)_2(N^{iPr}$-fmd), $Ti(tBuCp)_2(N^{nPr}$-fmd), $Ti(tBuCp)_2(N^{iBu}$-fmd), $Ti(tBuCp)_2(N^{nBu}$-fmd), $Ti(tBuCp)_2(N^{tBu}$-fmd), $Ti(tBuCp)_2(N^{sBu}$-fmd), $Ti(tBuCp)_2(N^{tAm}$-fmd), $Ti(tBuCp)_2(N^{TMS}$-fmd), $Ti(iPr_3Cp)_2(N^{Me}$-fmd), $Ti(iPr_3Cp)_2(N^{Et}$-fmd), $Ti(iPr_3Cp)_2(N^{iPr}$-fmd), $Ti(iPr_3Cp)_2(N^{nPr}$-fmd), $Ti(iPr_3Cp)_2(N^{iBu}$-fmd), $Ti(iPr_3Cp)_2(N^{nBu}$-fmd), $Ti(iPr_3Cp)_2(N^{tBu}$-fmd), $Ti(iPr_3Cp)_2(N^{sBu}$-fmd), $Ti(iPr_3Cp)_2(N^{tAm}$-fmd), $Ti(iPr_3Cp)_2(N^{TMS}$-fmd), $Ti(Cp^*)_2(N^{Me}$-fmd), $Ti(Cp^*)_2(N^{Et}$-fmd), $Ti(Cp^*)_2(N^{iPr}$-fmd), $Ti(Cp^*)_2(N^{nPr}$-fmd), $Ti(Cp^*)_2(N^{iBu}$-fmd), $Ti(Cp^*)_2(N^{nBu}$-fmd), $Ti(Cp^*)_2(N^{tBu}$-fmd), $Ti(Cp^*)_2(N^{sBu}$-fmd), $Ti(Cp^*)_2(N^{tAm}$-fmd), $Ti(Cp^*)_2(N^{TMS}$-fmd), $Ti(Me_3SiCp)_2(N^{Me}$-fmd), $Ti(Me_3SiCp)_2(N^{Et}$-fmd), $Ti(Me_3SiCp)_2(N^{iPr}$-fmd), $Ti(Me_3SiCp)_2(N^{nPr}$-fmd), $Ti(Me_3SiCp)_2(N^{iBu}$-fmd), $Ti(Me_3SiCp)_2(N^{nBu}$-fmd), $Ti(Me_3SiCp)_2(N^{tBu}$-fmd), $Ti(Me_3SiCp)_2(N^{sBu}$-fmd), $Ti(Me_3SiCp)_2(N^{tAm}$-fmd), $Ti(Me_3SiCp)_2(N^{TMS}$-fmd), $Ti(Cp)(Cp^*)(N^{Me}$-fmd), $Ti(Cp)(iPr_3Cp)(N^{Me}$-fmd), $Ti(Cp)(MeCp)(N^{Et}$-fmd), $Ti(Cp)(EtCp)(N^{iPr}$-fmd), $Ti(Cp)(iPrCp)(N^{nPr}$-fmd), $Ti(Cp)(nPrCp)(N^{iBu}$-fmd), $Ti(Cp)(iBuCp)(N^{nBu}$-fmd), $Ti(Cp)(tBuCp)(N^{tBu}$-fmd), $Ti(Cp)(tAmCp)(N^{sBu}$-fmd), $Ti(Cp)_2(N^{Et,\,tBu}$-fmd), $Ti(MeCp)_2(N^{Et,\,tBu}$-fmd) or $Ti(EtCp)_2(N^{Et,\,tBu}$-fmd).

4. The Titanium-containing film forming composition of claim 3, wherein the liquid precursor is $Ti(EtCp)_2(N^{iPr}$-fmd).

5. The Titanium-containing film forming composition of claim 1, wherein the liquid precursor has the formula Ti(R$_5$Cp)$_2$(N$^{R',R'}$R''-amd) or Ti(R$_5$Cp)$_2$(N$^R$R''-amd) when R=R'.

6. The Titanium-containing film forming composition of claim 5, wherein the liquid precursor is selected from the group consisting of Ti(Cp)$_2$(N$^{Me}$ Me-amd), Ti(Cp)$_2$(N$^{Et}$ Me-amd), Ti(Cp)$_2$(N$^{nPr}$ Me-amd), Ti(Cp)$_2$(N$^{iBu}$ Me-amd), Ti(Cp)$_2$(N$^{nBu}$ Me-amd), Ti(Cp)$_2$(N$^{sBu}$ Me-amd), Ti(Cp)$_2$(N$^{tAm}$ Me-amd), Ti(Cp)$_2$(N$^{TMS}$ Me-amd), Ti(MeCp)$_2$(N$^{Me}$ Me-amd), Ti(MeCp)$_2$(N$^{Et}$ Me-amd), Ti(MeCp)$_2$(N$^{nPr}$ Me-amd), Ti(MeCp)$_2$(N$^{iBu}$ Me-amd), Ti(MeCp)$_2$(N$^{nBu}$ Me-amd), Ti(MeCp)$_2$(N$^{tBu}$ Me-amd), Ti(MeCp)$_2$(N$^{sBu}$ Me-amd), Ti(MeCp)$_2$(N$^{tAm}$ Me-amd), Ti(MeCp)$_2$(N$^{TMS}$ Me-amd), Ti(EtCp)$_2$(N$^{Me}$ Me-amd), Ti(EtCp)$_2$(N$^{Et}$ Me-amd), Ti(EtCp)$_2$(N$^{iPr}$ Me-amd), Ti(EtCp)$_2$(N$^{nPr}$ Me-amd), Ti(EtCp)$_2$(N$^{iBu}$ Me-amd), Ti(EtCp)$_2$(N$^{nBu}$ Me-amd), Ti(EtCp)$_2$(N$^{tBu}$ Me-amd), Ti(EtCp)$_2$(N$^{sBu}$ Me-amd), Ti(EtCp)$_2$(N$^{tAm}$ Me-amd), Ti(EtCp)$_2$(N$^{TMS}$ Me-amd), Ti(iPrCp)$_2$(N$^{Me}$ Me-amd), Ti(iPrCp)$_2$(N$^{Et}$ Me-amd), Ti(iPrCp)$_2$(N$^{iPr}$ Me-amd), Ti(iPrCp)$_2$(N$^{nPr}$ Me-amd), Ti(iPrCp)$_2$(N$^{iBu}$ Me-amd), Ti(iPrCp)$_2$(N$^{nBu}$ Me-amd), Ti(iPrCp)$_2$(N$^{tBu}$ Me-amd), Ti(iPrCp)$_2$(N$^{sBu}$ Me-amd), Ti(iPrCp)$_2$(N$^{tAm}$ Me-amd), Ti(iPrCp)$_2$(N$^{TMS}$ Me-amd), Ti(tBuCp)$_2$(N$^{Me}$ Me-amd), Ti(tBuCp)$_2$(N$^{Et}$ Me-amd), Ti(tBuCp)$_2$(N$^{iPr}$ Me-amd), Ti(tBuCp)$_2$(N$^{nPr}$ Me-amd), Ti(tBuCp)$_2$(N$^{iBu}$ Me-amd), Ti(tBuCp)$_2$(N$^{nBu}$ Me-amd), Ti(tBuCp)$_2$(N$^{tBu}$ Me-amd), Ti(tBuCp)$_2$(N$^{sBu}$ Me-amd), Ti(tBuCp)$_2$(N$^{tAm}$ Me-amd), Ti(tBuCp)$_2$(N$^{TMS}$ Me-amd), Ti(iPr$_3$Cp)$_2$(N$^{Me}$ Me-amd), Ti(iPr$_3$Cp)$_2$(N$^{Et}$ Me-amd), Ti(iPr$_3$Cp)$_2$(N$^{iPr}$ Me-amd), Ti(iPr$_3$Cp)$_2$(N$^{nPr}$ Me-amd), Ti(iPr$_3$Cp)$_2$(N$^{iBu}$ Me-amd), Ti(iPr$_3$Cp)$_2$(N$^{nBu}$ Me-amd), Ti(iPr$_3$Cp)$_2$(N$^{tBu}$ Me-amd), Ti(iPr$_3$Cp)$_2$(N$^{sBu}$ Me-amd), Ti(iPr$_3$CO$_2$(N$^{tAm}$ Me-amd), Ti(iPr$_3$Cp)$_2$(N$^{TMS}$ Me-amd), Ti(Cp*)$_2$(N$^{Me}$ Me-amd), Ti(Cp*)$_2$(N$^{Et}$ Me-amd), Ti(Cp*)$_2$(N$^{iPr}$ Me-amd), Ti(Cp*)$_2$(N$^{nPr}$ Me-amd), Ti(Cp*)$_2$(N$^{iBu}$ Me-amd), Ti(Cp*)$_2$(N$^{nBu}$ Me-amd), Ti(Cp*)$_2$(N$^{tBu}$ Me-amd), Ti(Cp*)$_2$(N$^{sBu}$ Me-amd), Ti(Cp*)$_2$(N$^{tAm}$ Me-amd), Ti(Cp*)$_2$(N$^{TMS}$ Me-amd), Ti(Me$_3$SiCp)$_2$(N$^{Me}$ Me-amd), Ti(Me$_3$SiCp)$_2$(N$^{Et}$ Me-amd), Ti(Me$_3$SiCp)$_2$(N$^{iPr}$ Me-amd), Ti(Me$_3$SiCp)$_2$(N$^{nPr}$ Me-amd), Ti(Me$_3$SiCp)$_2$(N$^{iBu}$ Me-amd), Ti(Me$_3$SiCp)$_2$(N$^{nBu}$ Me-amd), Ti(Me$_3$SiCp)$_2$(N$^{tBu}$ Me-amd), Ti(Me$_3$SiCp)$_2$(N$^{sBu}$ Me-amd), Ti(Me$_3$SiCp)$_2$(N$^{tAm}$ Me-amd), Ti(Me$_3$SiCp)$_2$(N$^{TMS}$ Me-amd), Ti(Cp)(Cp*)(N$^{Me}$ Me-amd), Ti(Cp)(iPr$_3$Cp)(N$^{Me}$ Me-amd), Ti(Cp)(MeCp)(N$^{Et}$ Me-amd), Ti(Cp)(EtCp)(N$^{iPr}$ Me-amd), Ti(Cp)(iPrCp)(N$^{nPr}$ Me-amd), Ti(Cp)(nPrCp)(N$^{iBu}$ Me-amd), Ti(Cp)(iBuCp)(N$^{nBu}$ Me-amd), Ti(Cp)(tBuCp)(N$^{tBu}$ Me-amd), Ti(Cp)(tAmCp)(N$^{sBu}$ Me-amd), Ti(Cp)$_2$(N$^{iPr}$ Et-amd), Ti(Cp)$_2$(N$^{iPr}$ nPr-amd), Ti(Cp)$_2$(N$^{iPr}$ iPr-amd), Ti(Cp)$_2$(N$^{iPr}$ tBu-amd), Ti(Cp)$_2$(N$^{iPr}$ iBu-amd), Ti(Cp)$_2$(N$^{iPr}$ sBu-amd), Ti(MeCp)$_2$(N$^{iPr}$ Et-amd), Ti(MeCp)$_2$(N$^{iPr}$ nPr-amd), Ti(MeCp)$_2$(N$^{iPr}$ iPr-amd), Ti(MeCp)$_2$(N$^{iPr}$ tBu-amd), Ti(MeCp)$_2$(N$^{iPr}$ nBu-amd), Ti(MeCp)$_2$(N$^{iPr}$ iBu-amd), Ti(MeCp)$_2$(N$^{iPr}$ sBu-amd), Ti(EtCp)$_2$(N$^{iPr}$ Et-amd), Ti(EtCp)$_2$(N$^{iPr}$ nPr-amd), Ti(EtCp)$_2$(N$^{iPr}$ iPr-amd), Ti(EtCp)$_2$(N$^{iPr}$ tBu-amd), Ti(EtCp)$_2$(N$^{iPr}$ nBu-amd), Ti(EtCp)$_2$(N$^{iPr}$ iBu-amd), and Ti(EtCp)$_2$(N$^{iPr}$ sBu-amd).

7. The Titanium-containing film forming composition of claim 6, wherein the liquid precursor is Ti(EtCp)$_2$(N$^{iPr}$ Me-amd).

8. The Titanium-containing film forming composition of claim 1, the composition comprising between approximately 95.0% w/w and approximately 100.0% w/w of the liquid precursor.

9. The Titanium-containing film forming composition of claim 1, the composition comprising between approximately 0.0% w/w and approximately 5.0% w/w impurities.

10. A method of forming a Titanium-containing film, the method comprising introducing into a reactor having a substrate therein a vapor of a Titanium-containing film forming composition comprising a liquid precursor having the formula

wherein Cp is cyclopentadienyl, each R is independently H, an alkyl group, or R'$_3$Si, with each R' independently being H or an alkyl group; and L is a formamidinate ligand having the chemical formula R—N—C(H)=N—R', shown as:

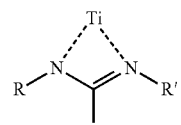

(N$^{R,R'}$-fmd) or amidinate ligand having the chemical formula R—N—C(R'')=N—R', shown as:

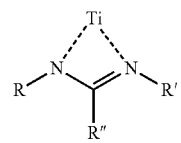

(N$^{R,R'}$, R''-amd), wherein R and R' are alkyl groups or SiMe$_3$ and R'' is an alkyl group, and
depositing at least part of the Titanium-containing film forming composition onto the substrate.

11. The method of claim 10, further comprising introducing a reactant into the reactor.

12. The method of claim 11, wherein the reactant is selected from the group consisting of N$_2$, N$_2$H$_4$, NH$_3$, N(SiH$_3$)$_3$, nitrogen radicals thereof, and mixtures thereof.

13. The method of claim 11, wherein the reactant is selected from the group consisting of O$_2$, O$_3$, H$_2$O, H$_2$O$_2$ NO, N$_2$O, NO$_2$, oxygen radicals thereof, and mixtures thereof.

14. The method of claim 11, wherein the Titanium-containing film forming composition and the reactant are introduced into the reactor simultaneously and the reactor is configured for chemical vapor deposition.

15. The method of claim 11, wherein the Titanium-containing film forming composition and the reactant are introduced into the chamber sequentially and the reactor is configured for atomic layer deposition.

16. The method of claim 10, wherein the substrate is an electrode.

17. The method of claim 16, wherein the substrate is TiN, NbN or Ru and the Titanium-containing film forming composition is used to form a DRAM capacitor.

18. The method process of claim 10, wherein the substrate is silicon oxide (SiO$_2$).

19. The method of claim 18, wherein the Titanium-containing film forming composition is used to form a hard mark used in Double or triple Patterning Technology.

20. The method of claim 11, wherein the Titanium-containing film forming composition comprises Ti(EtCp)$_2$(N$^{iPr}$ Me-amd) or Ti(iPrCp)$_2$(N$^{iPr}$ Me-amd) and the reactant is O$_3$.

* * * * *